United States Patent
Rogers et al.

(10) Patent No.: US 7,704,684 B2
(45) Date of Patent: Apr. 27, 2010

(54) METHODS AND DEVICES FOR FABRICATING THREE-DIMENSIONAL NANOSCALE STRUCTURES

(75) Inventors: John A. Rogers, Champaign, IL (US);
Seokwoo Jeon, Champaign, IL (US);
Jangung Park, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 1402 days.

(21) Appl. No.: 11/001,689

(22) Filed: Dec. 1, 2004

(65) Prior Publication Data

US 2006/0286488 A1 Dec. 21, 2006

Related U.S. Application Data

(60) Provisional application No. 60/526,245, filed on Dec. 1, 2003, provisional application No. 60/598,404, filed on Aug. 2, 2004.

(51) Int. Cl.
*G03F 7/00* (2006.01)
(52) U.S. Cl. .................. 430/325; 430/396; 430/945
(58) Field of Classification Search ............... None
See application file for complete search history.

(56) References Cited

U.S. PATENT DOCUMENTS

| | | | |
|---|---|---|---|
| 4,766,670 A | 8/1988 | Gazdik et al. | |
| 6,403,397 B1 | 6/2002 | Katz | |
| 2002/0110766 A1 | 8/2002 | Tsai et al. | |
| 2003/0227116 A1 | 12/2003 | Halik et al. | |
| 2004/0027675 A1* | 2/2004 | Wu et al. | 359/619 |
| 2004/0192082 A1 | 9/2004 | Wagner et al. | |

| | | |
|---|---|---|
| 2005/0124712 A1 | 6/2005 | Anderson et al. |

FOREIGN PATENT DOCUMENTS

| | | |
|---|---|---|
| JP | 11-026344 | 1/1999 |
| TW | 367570 | 8/1999 |
| TW | 494257 | 7/2002 |

(Continued)

OTHER PUBLICATIONS

Bates, F.S. (1991) "Polymer-Polymer Phase Behavior," *Science* 251:898-905.

(Continued)

*Primary Examiner*—John A. McPherson
(74) *Attorney, Agent, or Firm*—Greenlee, Winner and Sullivan, P.C.

(57) ABSTRACT

The present invention provides methods and devices for fabricating 3D structures and patterns of 3D structures on substrate surfaces, including symmetrical and asymmetrical patterns of 3D structures. Methods of the present invention provide a means of fabricating 3D structures having accurately selected physical dimensions, including lateral and vertical dimensions ranging from 10s of nanometers to 1000s of nanometers. In one aspect, methods are provided using a mask element comprising a conformable, elastomeric phase mask capable of establishing conformal contact with a radiation sensitive material undergoing photoprocessing. In another aspect, the temporal and/or spatial coherence of electromagnetic radiation using for photoprocessing is selected to fabricate complex structures having nanoscale features that do not extend entirely through the thickness of the structure fabricated.

3 Claims, 19 Drawing Sheets

FOREIGN PATENT DOCUMENTS

WO    WO 02/073699 A    9/2002

OTHER PUBLICATIONS

Boltau et al. (1998) "Surface-Induced Structure Formation of Polymer Blends on Patterned Substrates," *Nature* 391:877-879.
Bowden et al. (2001) "Molecule-Mimetic Chemistry and Mesoscale Self-Assembly," *Acc. Chem. Res.* 34:231-238.
Braun et al. (1999) "Electrochemically Grown Photonic Crystals," *Nature* 402:603-604.
Campbell et al. (2000) "Fabrication of Photonic Crystals for the Visible Spectrum by Holographic Lithography," *Nature* 404:53-56.
Dinsmore et al. (2002) "Colloidosomes: Selectively Permeable Capsules Composed of Colloidal Particles," *Science* 298:1006-1009.
Divliansky et al. (2003) "Fabrication of Three-Dimensional Polymer Photonic Crystal Structures Using Single Diffraction Element Interference Lithography," *Appl. Phys. Lett.* 82(11):1667-1669.
Edrington et al. (2001)"Polymer-Based Photonic Crystals," *Adv. Mater.* 13:421-425.
Fink et al. (1999) "Block Copolymers as Photonic Bandgap Materials," *J. Lightwave Tech.* 17:1963-1969.
Furneaux et al. (1989) "The Formation of Controlled-Porosity Membranes from Anodically Oxidized Aluminum," *Nature* 337:147-149.
Hoyer, P. (1996) Semiconductor Nanotube Formation by a Two-Step Template Process, *Adv. Mater.* 8:857-859.
Huang et al. (2001) "Directed Assembly of One-Dimensional Nanostructures into Functional Networks," *Science* 291:630-633.
Jacobs et al. (2002) "Fabrication of a Cylindrical Display by Patterned Assembly," *Science* 296:323-325.
Jiang et al. (1999) "Preparation of Macroporous Metal Films from Colloidal Crystals," *J. Am. Chem. Soc.* 121:7957-7958.
Johnson et al. (1999) "Ordered Mesoporous Polymers of Tunable Pore Size from Colloidal Silica Templates," *Science* 283:963-965.
Kawata et al. (2001) "Finer Features for Functional Microdevices," *Nature* 412:697-698.
Kim et al. (2003) "Epitaxial self-assembly of block copolymers on lithographically defined nanopatterned substrates," *Nature* 424:411-414.
Klein-Wiele et al. (2003) "Fabrication of Periodic Nanostructures by Phase-Controlled Multiple-Beam Interference," *Appl. Phys. Lett.* 83(23):4707-4709.
Martin, C.R. (1995) "Template Synthesis of Electronically Conductive Polymer Nanostructures," *Acc. Chem. Res.* 28:61-68.
Michel et al. (2001) Printing Meets Lithography: Soft Approaches to High-Resolution Patterning, *IBM J. Res. Dev.* 45:697-719.
Morkved et al. (1994) "Mesoscopic Self-Assembly of Gold Islands on Diblock-Copolymer Films," *Appl. Phys. Lett.* 64:422-424.
Park et al. (1998) "Fabrication of Three-Dimensional Macroporous Membranes with Assemblies of Microspheres as templates," *Chem. Mater.* 10:1745-1747.
Park et al. (1997) "Block Copolymer Lithography: Periodic Arrays of ~$10^{11}$ Holes in 1 Square Centimeter," *Science* 276:1401-1404.
Quake et al (2000) "From Micro- to Nanofabrication with Soft Materials," *Science* 290:1536-1540.
Rogers et al. (1998) "Generating ~90 Nanometer Features Using Near Field Contact Mode Photolithography with an Elastomeric Phase Mask," *J. Vac. Sci. Technol.* 16(1):59-68.
Smay et al. (2002) "Colloidal Inks for Directed Assembly of 3-D Periodic Structures," *Langmuir* 18:5429-5437.
Trau et al. (1997) "Microscopic Patterning of Orientated Mesoscopic Silica Through Guided Growth," *Nature* 390:674-676.
Velev et al. (1997) "Porous silica via colloidal crystallization," *Nature* 389:447-448.
Vlasov et al. (2001) "On-Chip Natural Assembly of Silicon Photonic Bandgap Crystals," *Nature* 414:289-293.
Xia et al. (1999) "Unconventional Methods for Fabricating and Patterning Nanostructures," *Chem. Rev.* 99:1823-1848.
Yang et al. (1997) "Mesoporous Silica with Micrometer-Scale Desgns," *Adv. Mater.* 9:811-814.
Yang et al. (2002) "Creating Periodic Three-Dimensional Structures by Multibeam Interface of Visible Laser," *Chem. Mater.* 14:2831-2833.
Yeh et al. (1994) "Fluidic Self-Assembly for the Integration of GaAs Light-Emitting Diodes on Si Substrates," *IEEE Photon. Techn. Lett.* 6:706-708.
Zakhidov et al. (1998) "Carbon Structure with Three-Dimensional Periodicity at Optical Wavelengths," *Science* 282:897-901.
Zhou et al. (2002) "An Efficient Two-Photon-Generated Photoacid Applied to Positive-Tone 3D Microfabrication," *Science* 296:1106-1109.
Jeon et al. (Aug. 2004) "Fabricating Complex Three-Dimensional Nanostructures with High Resolution Conformable Phase Masks," *Proc. Natl. Acad. Sci. USA* 101:12428-12433.
Jeon et al. (Aug. 2004) "Three Dimensional Nanofabrication with Rubber Stamps and Conformable Photomasks," *Adv. Mater.* 16:1369-1373.
Maldovan et al. (Sep. 2004) "Diamond-Structured Photonic Crystals," *Nature Materials* 3:593-600.
Meisel et al. (Oct. 2004) "Three-Dimensional Photonic Crystals by Holographic Lithography Using the Umbrella Configuration: Symmetries and Complete Photonic Band Gaps," *Phys. Rev. B.* 70:165104-1-165104-10.
Menard et al. (Pub. on-line Jul. 2004) "Improved Surface Chemistries, Thin Film Deposition Techniques, and Stamp Designs for Nanotransfer Printing," *Langmuir* 20:6871-6878.
Rogers et al. (1998) "Using Printing and Molding Techniques to Produce Distributed Feedback and Bragg Reflector Resonators for Plastic Lasers," *Appl. Phys. Lett.* 73:1766-1768.
Roundy et al. (Jun. 2003) "Photonic Crystal Structure with Square Symmetry within Each Layer and a Three-Dimensional Band Gap," *Appl. Phys Lett.* 82:3835-3837.
Sharp et al. (Nov. 2003) "Holographic Photonic Crystals with Diamond Symmetry," *Phys. Rev. B* 68:205102/1-205102/6.
Toader et al. (Nov. 2003) "Photonic Band Gaps Based on Tetragonal Lattices of Slanted Pores," *Phys. Rev. Lett.* 90:233901/1-233901/4.
Toader et al. (Jan. 2004) "Photonic Band Gap Architectures for Holographic Lithography," *Phys. Rev. Lett.* 92:043905-1-043905-4.
Duan et al., "High-Performance Thin-Film Transistors using Semiconductor Nanowires and Nanoribbons," (2003) *Nature* 425: 274-278.
Pan et al., "Nanobelts of Semiconducting Oxides," (2001) *Science* 291: 1947-1949.
Zaumseil et al., "Three-Dimensional and Multilayer Nanostructures Formed by Nanotransfer Printing," (2003) *Nano Lett.* 3(9): 1223-1227.
Office Action, Corresponding to U.S. Appl. No. 11/145,542, mailed Apr. 5, 2007.
Search Report for Patent Application, Corresponding to Republic of China (Taiwan) Patent Application No. 094118507 dated Feb. 24, 2007.
Search Report for Corresponding International PCT Application No. PCT/US05/19354 dated Apr. 18, 2007.
International Search Report for PCT Application No. PCT/US2004/040192, Jul. 6, 2005.

\* cited by examiner

Fig. 6A
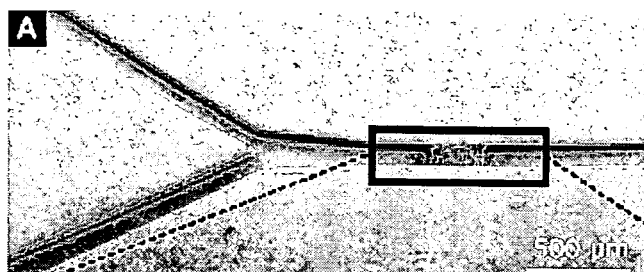
Fig. 6B
Fig. 6C 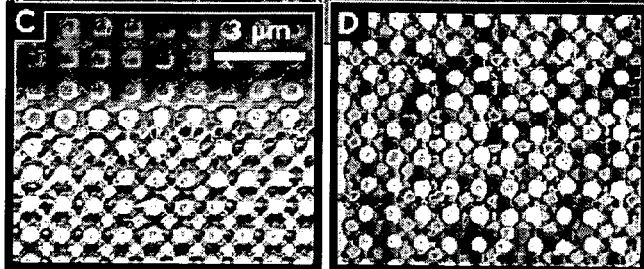 Fig. 6D
Fig. 6E 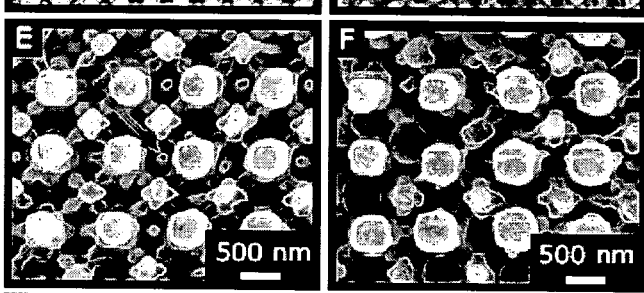 Fig. 6F
Fig. 6G
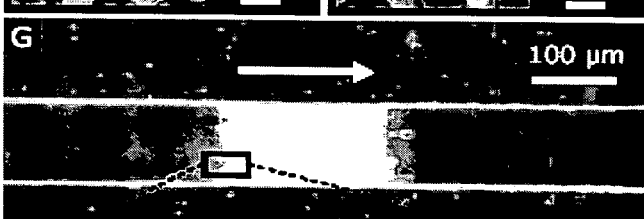
Fig. 6H
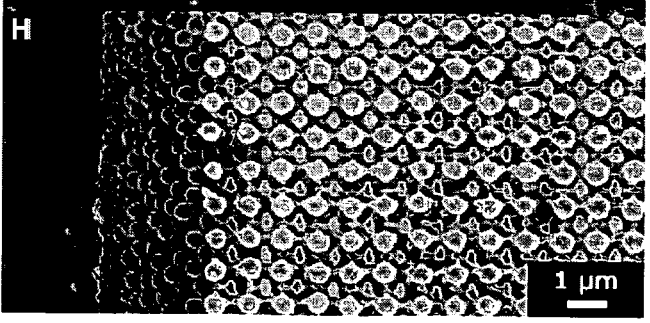

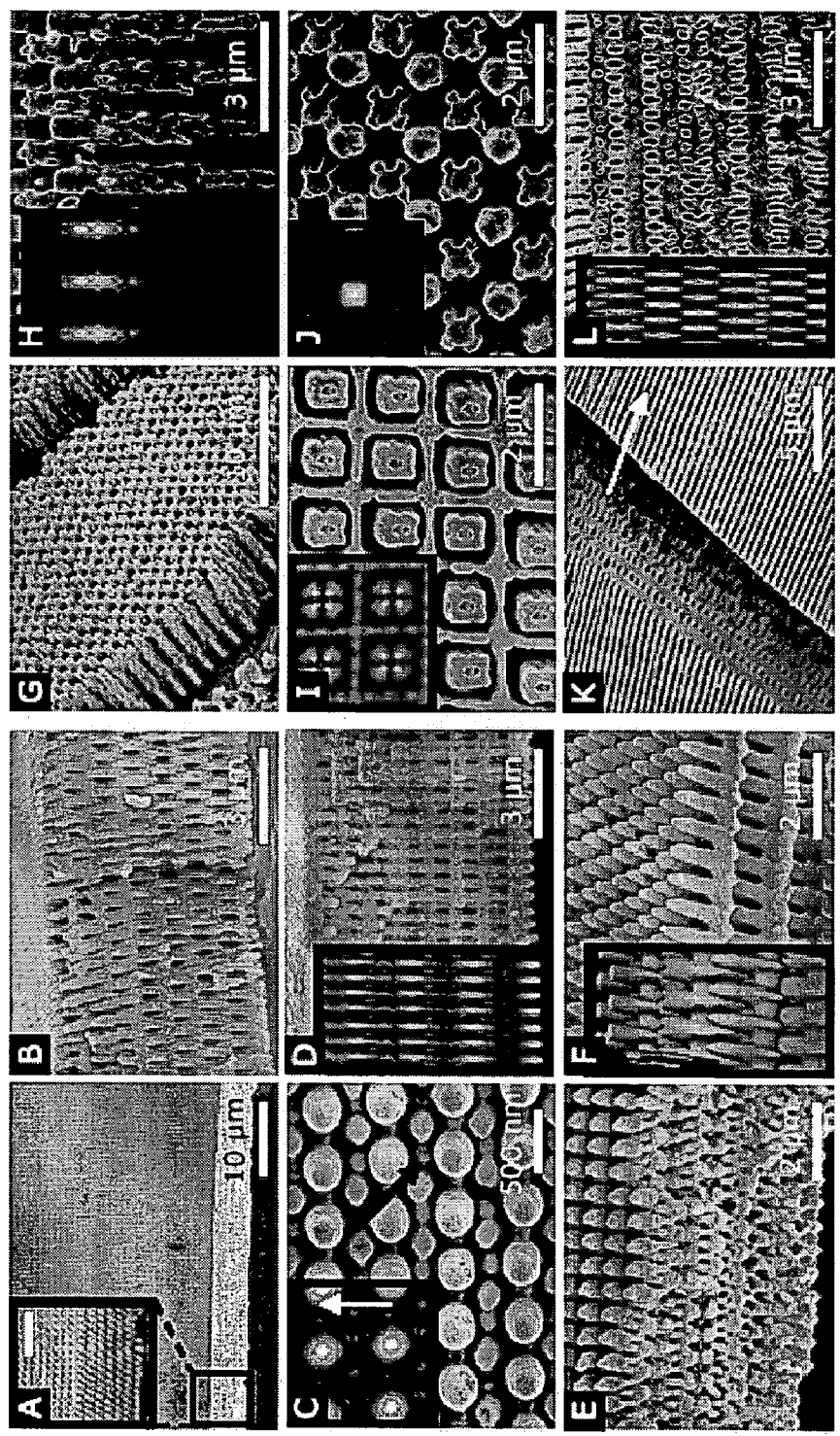
Fig. 7A-L

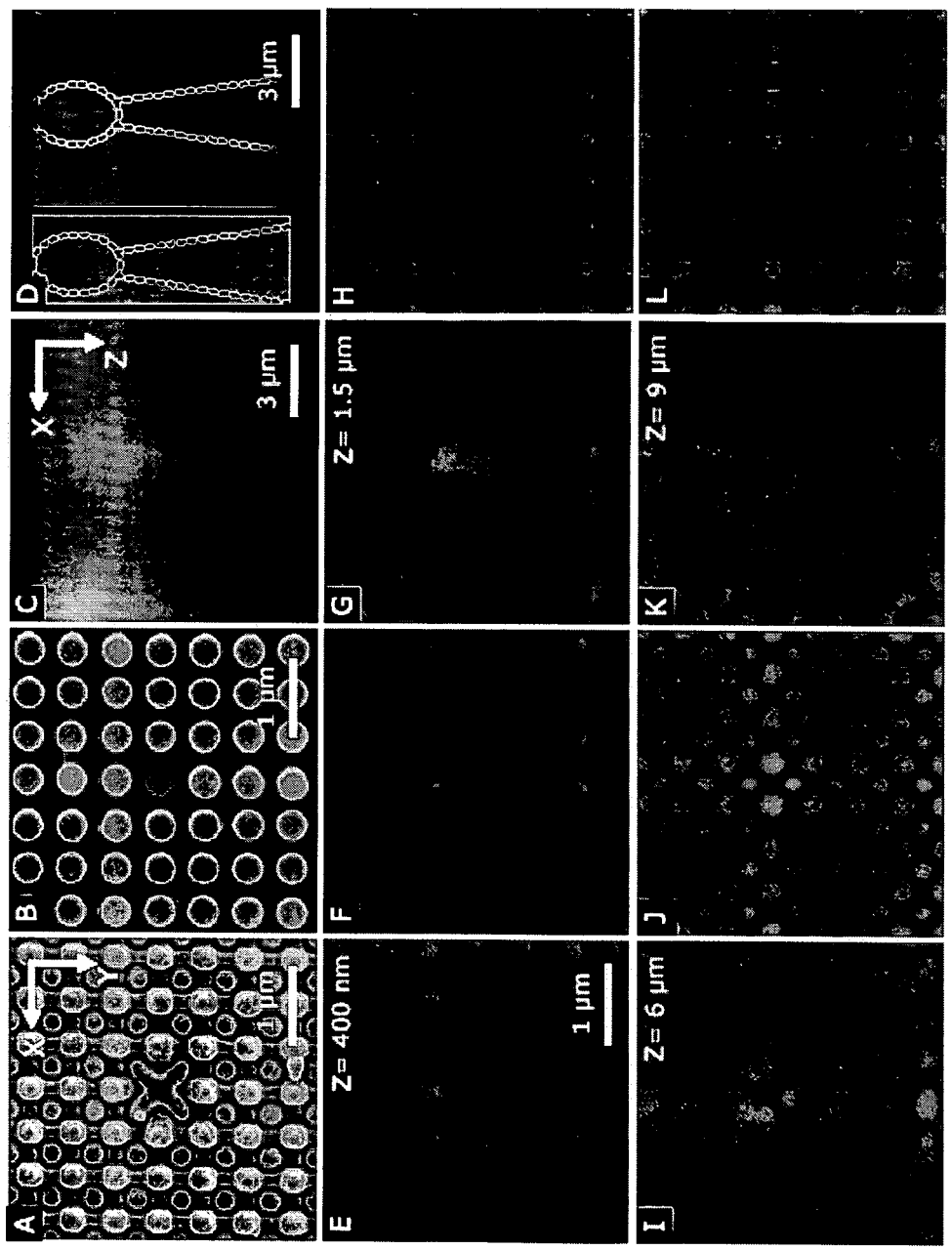
Fig. 8A - L

[ diameter of tube: 7mm ]

[ diameter of tube: 3mm ]

1 μm

1 μm

Fig. 13A
Fig. 13B
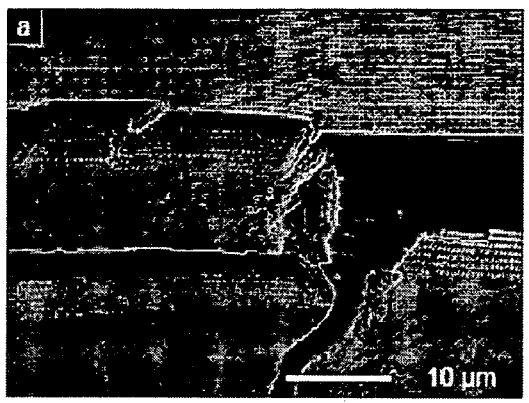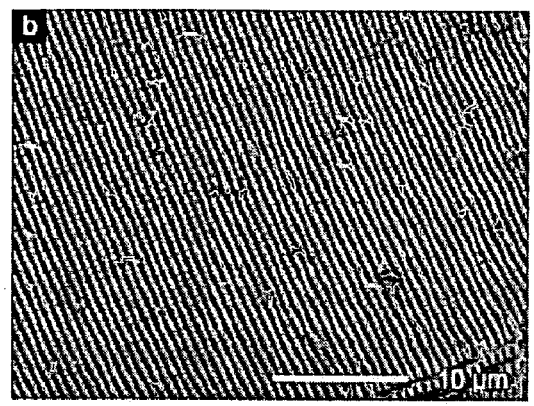
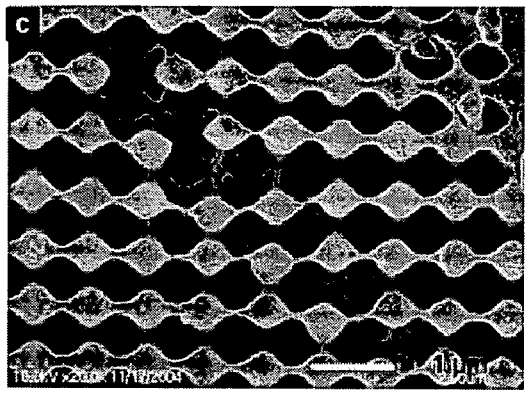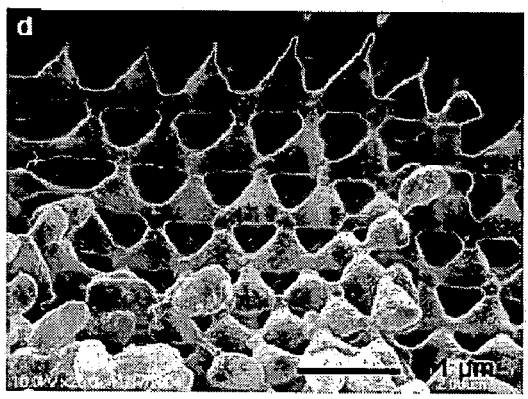
Fig. 13C
Fig. 13D

— 2 μm

— 2 μm

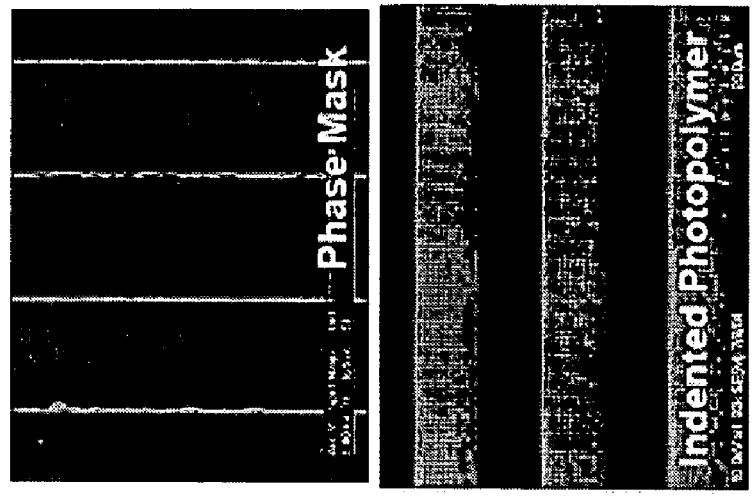
Fig. 16C  Fig. 16B  Fig. 16A
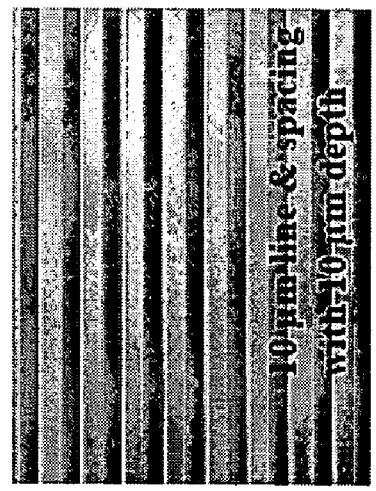
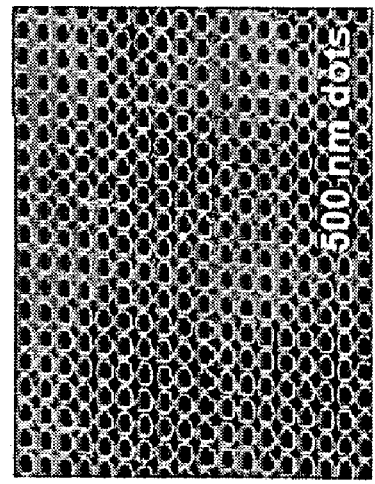

METHODS AND DEVICES FOR FABRICATING THREE-DIMENSIONAL NANOSCALE STRUCTURES

CROSS-REFERENCE TO RELATED APPLICATIONS

This application claims priority under 35 U.S.C. 119(e) to U.S. provisional Patent Applications 60/526,245 and 60/598, 404 filed Dec. 1, 2003 and Aug. 2, 2004, respectively, which are hereby incorporated by reference in their entireties to the extent not inconsistent with the disclosure herein.

STATEMENT REGARDING FEDERALLY SPONSORED RESEARCH OR DEVELOPMENT

This invention was made with Government support under Contract Number DEFG02-91ER45439 awarded by the Department of Energy (DOE). The Government has certain rights in the invention.

BACKGROUND OF INVENTION

Advances in nanoscience and technology increasingly rely on techniques for fabricating structures comprising features having selected physical dimensions, such as lengths, heights and widths, in the nanometer regime. Methods that have emerged from the microelectronics industry, such as deep UV projection mode lithography and electron beam lithography, are well suited for patterning two dimensional (2D) nanostructures on ultraflat glass or semiconductor surfaces. The limited depth of focus of these approaches, however, makes it challenging, if not commercial unfeasible, to fabricate directly the types of three dimensional (3D) nanostructures that are important for many areas of nanotechnology. To extend the applicability of these methods, indirect approaches of generating 3D nanostructures have been developed with employ repetitive application of steps that involve 2D patterning of sacrificial resists, depositing functional materials, etching or polishing them, and removing the sacrificial layers. These strategies, however, typically require sophisticated facilities and are difficult to implement for structures that demand more than a few layers. As a result of these well recognized limitations, there is presently a demand for high throughput, low cost fabrication methods capable of generating a wide variety of nanostructures.

Recently, new methods of fabricating 3D nanostructures have been developed. Methods based on colloidal sedimentation, polymer phase separation, templated growth, fluidic self-assembly, multiple beam interference lithography, and various approaches based on printing, molding, and writing are all useful for building different classes of 3D nanostructures. Nevertheless, these techniques have certain limitations in the geometries, physical dimensions and sizes of patterns that they can generate. For example, two-photon lithography can produce an impressive variety of structures, but its serial operation makes it difficult and labor intensive to pattern large substrate areas or to generate large numbers of structures.

Holographic and photolithographic methods also provide useful methods for fabricating structures. Exemplary methods for generating patterns and structures are described in "Fabrication of photonic crystals for the visible spectrum by holographic lithography," Campbell, M., Sharp, D. N., Harrison, M. T., Denning, R. G. and Turberfield, A. J., Nature, Vol. 404, pgs. 53-56 (2000) and "Generating ≈90 nanometer features using near field contact mode photolithography with an elastomeric phase mask," Rogers, J. A., Paul, K. E., Jackman, R. J. and Whitesides, G. M., J. Vac. Sci. Technology. B, Vol 16(1), pgs, 59-68 (1998), which are hereby incorporated by reference in their entireties to the extent not inconsistent with the present description.

SUMMARY OF THE INVENTION

The present invention provides methods, devices and device components for fabricating 3D structures and patterns of 3D structures. It is an object of the present invention to provide methods for generating 3D structures having well defined and selected physical dimensions, particularly structures comprising a plurality of well defined features having at least one physical dimension on the order of 10 s of nanometers to 1000 s of nanometers. It is further an object of the present invention to provide efficient methods for generating 3D structures and patterns of 3D structures, particularly 3D structures comprising nanoscale features, that utilize a simple optical arrangement which does not requiring lasers or a large number of optical components. It is yet another object of the present invention to provide versatile fabrication methods capable of generating a wide range of useful 3D structures, such as 3D structures comprising symmetrical patterns of nanoscale features, asymmetrical patterns of nanoscale features, patterns of nanoscale features having one or more controlled defect sites, and patterns of nanoscale features having a selected density of features as a function of depth.

The present invention provides methods, devices and device components capable of fabricating 3D structures and patterns of 3D structures on or in substrates, devices and device components. In one embodiment, the present invention provides methods for fabricating patterns comprising a plurality of independent 3D structures having at least one nanoscale physical dimension. In another embodiment, the present invention provides methods for fabricating one or more unitary 3D structures comprising a pattern of features, including nanoscale features. 3D structures and features of 3D structures fabricated by the methods of the present invention may have wide range of shapes, such as cubes, columns, ribbons, posts and rectangular solids, and physical dimensions, such as heights, lengths, widths, radii and radii of curvature, ranging from 10 s of nanometers to 1000 s of nanometers. Methods of the present invention are capable of fabricating complex 3D structures and patterns of 3D structures comprising a plurality of features having selected orientations, arrangements and positions with respect to each other. Methods of the present invention are capable of fabricating 3D structures and patterns of 3D structures on substrates having a range of chemical compositions, such as flexible plastics, glasses, ceramics, carbonaceous materials, metals and nonmetals, and substrates having a range of physical geometries and morphologies, including flat surfaces, curved surfaces, convex surfaces, concave surfaces, smooth surfaces and rough surfaces. The methods and devices of the present invention are capable of fabricating, assembling and/or integrating 3D structures and patterns of 3D structures within at least partially transparent regions of a device or a device component, such as fabrication, assembly and or integration into selected regions of a microelectromechanical system, nanoelectromechanical system, a microfluidic system or a nanofluidic system. 3D dimensional structures comprising periodic or aperiodic patterns of 3D features are generated by the methods and devices of the present invention, including patterns of 3D features having one or more controlled defect sites. Methods of the present invention are capable of efficiently patterning very large substrate areas using a simple, low cost experimental setup, such as an experimental set up comprising a conventional narrow bandwidth lamp, such as a low pressure mercury and a mask element, such as an elastomeric phase mask.

The experimental simplicity of the optical configurations used in the present invention and the wide range of 3D structures that can be fabricated are two attractive characteristics of the present approach to 3D nanopatterning. 3D structures and patterns of structures fabricated by the methods of the present invention may function as sacrificial templates to provide a means of patterning a wide variety of material types. Applications of the methods and devices of the present invention include, but are not limited to, na notechnology, photonics, photonic bandgap materials. sensing, column materials for chromatography, catalyst supports, fuel cell, medical filters, microelectronics, microfluidics, nanofluidics microelectromechanical systems and nanoelectromechanical systems, sub-wavelength optical filters and ultrathin holographic correlators, high surface area elements for sensors, drug delivery; nanostructured surfaces to control wetting phenomena and information storage.

In one aspect, the present invention provides methods for making a 3D structure or pattern of 3D structures, wherein an optical interference pattern having well characterized 3D distributions of electromagnetic radiation intensities and states of polarization is used to chemically and/or physically modify a radiation sensitive material. In an exemplary embodiment, a substantially coherent beam of electromagnetic radiation is generated and directed onto a mask element, such as a phase mask, in optical communication with a radiation sensitive material. Passage of electromagnetic radiation through the mask element generates a plurality of beams of electromagnetic radiation propagating along different propagation axes that undergo optical interference, thereby generating an optical interference pattern within the radiation sensitive material. In a useful embodiment, the mask element and the radiation sensitive material are in direct optical communication such that the plurality of beams of electromagnetic radiation generated by the mask element are directed onto the radiation sensitive material, are combined and undergo optical interference, without use of additional optical components, such as a focusing lens, for steering and/or combining the beams of electromagnetic radiation within the radiation sensitive material. Interaction of electromagnetic radiation with the radiation sensitive material generates chemically or physically modified regions, which are selectively distributed throughout the radiation sensitive material. In one embodiment, interactions of electromagnetic radiation with the radiation sensitive material directly generates one or more 3D structures. In other useful embodiments of the present invention, one or more 3D structures are generated by removing at least a portion of the chemically or physically modified regions or by removing at least a portion of the radiation sensitive material which is not chemically or physically modified, for example by developing the radiation sensitive material after treatment with electromagnetic radiation. Optionally, the methods of the present invention may further comprise either one or both of the additional steps of: (1) establishing and maintaining conformal contact between the mask element and radiation sensitive material during exposure to electromagnetic radiation and (2) selecting the extent of collimation (e.g. spatial and/or temporal coherence length) of the substantially coherent beam of electromagnetic radiation directed onto the mask element.

Mask elements of the present invention selectively adjust the intensities of transmitted electromagnetic radiation, the number and propagation directions of beams of electromagnetic radiation generated by the mask element, phases of transmitted electromagnetic radiation, states of polarization of transmitted electromagnetic radiation or any combination of these parameters in a manner providing optical interference patterns having selected well defined spatial distributions of electromagnetic radiation intensities and states of polarization. Exemplary mask elements comprise phase masks, amplitude varying optical elements, polarization varying elements, beam splitters and/or unitary optical elements combining various functional capabilities of these elements. Optical interference patterns generated by mask elements of the present invention are used to photoinitiate chemical reactions which chemically and/or physically modify selected regions of a radiation sensitive material. Photoinitiation of chemical reactions may be the result of single photon absorption processes, multiphoton absorption processes or a combination of both single and multiphoton absorption process in the radiation sensitive material. The extent and localization of chemical or physical modifications depends principally on the 3D spatial distributions of intensities and polarization states of electromagnetic radiation interacting with the radiation sensitive material. Use of mask elements capable of generating optical interference patterns having well defined spatial distributions of electromagnetic radiation intensities and states of polarization, therefore, provides for accurate control over the 3D spatial distribution of chemically modified regions of a radiation sensitive material. This capability of the present invention allows for fabrication of 3D structures comprising features having selected, well characterized physical dimensions. In addition, this aspect of the present invention allows for fabrication of 3D structures and patterns of 3D structures comprising a plurality of features having relative orientations, arrangements and positions selected with high accuracy.

The intensity distributions, distributions of polarization states or both of electromagnetic radiation comprising 3D interference patterns of the present invention may be selectively adjusted by any means known in the art of optical interferometry and holography. Exemplary means of selectively adjusting intensities and polarization states of electromagnetic radiation generated by mask elements of the present invention include, but are not limited to, manipulation of the phases, transmitted intensities, propagation directions, numbers of beams and/or polarization states of the substantially coherent beam of electromagnetic radiation or selected components of the substantially coherent beam of electromagnetic radiation. In another embodiment, the temporal and/or spatial coherence of the substantially coherent beam of electromagnetic radiation is manipulated to control and select the intensity and/or polarization state distributions of electromagnetic radiation in the radiation sensitive material.

In an exemplary embodiment of the present invention, the phases of electromagnetic radiation transmitted by the mask element are controlled by selection of the optical thickness of a mask element or regions of a mask element. An exemplary mask element is characterized by a two dimensional distribution of selected optical thicknesses. Optical thickness may be selected by variation of the refractive index and/or composition of a mask element or regions of a mask element. Alternatively, optical thickness may be selected by variation of the physical thickness of a mask element or regions of a mask element. In an exemplary embodiment, the mask element is an at least partially transparent phase mask having a two dimensional distribution of optical thicknesses, such as that provided by a relief pattern, selected to provide a optical interference pattern corresponding to a desired 3D shape or structure. Exemplary relief patterns are located on a contact surface of the mask element which is positioned in contact, for example conformal contact, with a contact surface of the radiation sensitive material. Exemplary relief patterns of the present invention comprise a pattern of relief features having one or more selected physical dimensions, such as lengths, widths, heights, radius, or periodicity of relief features, that are comparable to the wavelength of the light passed through the mask element.

The present invention also includes methods and devices wherein the intensities of electromagnetic radiation transmitted by the mask element are also controlled by selection of the absorption properties, scattering properties or reflection properties of the mask element or regions of the mask element. In an exemplary embodiment, the mask element is a partially transparent optical element characterized by a two dimensional distribution of selected absorption coefficients, extinction coefficients, reflectivities or any combination of these parameters which results in a two dimensional distribution of transmitted electromagnetic radiation intensities upon illumination that is selected to provide a optical interference pattern corresponding to desired 3D shape or structure. In this aspect of the present invention, electromagnetic radiation transmitted by selected regions of the mask element may be attenuated by incorporation of absorbing, scattering and/or reflective material into the mask element. For example, intensities of electromagnetic radiation transmitted by selected regions of the mask element may be selected by incorporation of thin films, such as thin metal, semiconductor or dielectric films, which reflect, scatter and absorb incident electromagnetic radiation. Incorporating amplitude modulating elements, such as thin metal films, onto the surface of the phase masks and exploiting reflecting substrates adds considerable additional flexibility in the types of 3D structures that can be fabricated by the present methods. In an exemplary embodiment of the present invention, the mask element has thin films that comprise a two dimensional or 3D pattern on one or more surfaces of the mask element. Exemplary thin films include, but are not limited to, one or more vapor deposited thin gold films having thicknesses selected over the range of about 10 nm to about 100 nm. Thin gold films having thicknesses less than about 80 nm result in partial transmission of incident electromagnetic radiation and thin gold films having thickness greater than about 80 nm results in complete absorption, scattering and/or reflection of incident electromagnetic radiation.

Mask elements and radiation sensitive materials of the present invention are preferably optically aligned with respect to each other to provide a selected orientation and position of the optical interference pattern within the bulk of radiation sensitive material. Control of the orientation and position of the optical interference pattern with respect to the radiation sensitive material is useful for fabricating structures having desired 3D shapes and for providing (e.g. integrating or assembling) 3D structures on or within substrates or devices with good placement accuracy. Optical positioning may be provided by any means capable of aligning external surfaces of the mask element and radiation sensitive material in a well defined relative orientation. In transmission mode, the mask element and the radiation sensitive material are optically aligned such that electromagnetic radiation transmitted by the mask element generates a selected optical interference pattern within the radiation sensitive material. Therefore, in transmission mode, an optical interference pattern is generated in a radiation sensitive material by transmission of electromagnetic radiation through the mask element. In reflection mode, the mask elements and the radiation sensitive material are optically aligned such that electromagnetic radiation reflected by the mask element generates a selected optical interference pattern within the radiation sensitive material. Therefore, in reflection mode, an optical interference pattern is generated in a radiation sensitive material by reflection of electromagnetic radiation by the mask element. The present invention also includes embodiments wherein an optical interference pattern is generated in a radiation sensitive material by a combination of transmission of electromagnetic radiation through the mask element and reflection of electromagnetic radiation by the mask element.

In an exemplary embodiment, one or more contact surfaces of the mask element and the radiation sensitive material are in conformal contact, preferably atomic scale (<5 nm) conformal contact. In the context of this description, the term "contact surface" refers to surfaces of the mask element and the radiation sensitive material which are in contact with each other. Conformal contact between at least a portion of the mask element and at least a portion the radiation sensitive material provides an effective means of establishing and maintaining a selected optical alignment of these elements during processing necessary for fabricating 3D structures having good pattern definition and resolution. Use of mask elements capable of establishing conformal contact with the surface of a radiation sensitive material is useful in the methods of the present invention because conformal contact of these elements yields optical alignment with nanometer precision in the vertical direction (i.e. direction along an axis parallel to the propagation axis of the beam of electromagnetic radiation incident on the mask element). In addition, establishment of conformal contact between at least a portion of the mask element and at least a portion the radiation sensitive material provides an effective means of assembling, incorporating or positioning 3D structures on substrates or into devices with good placement accuracy. Furthermore, use of conformal contact in the present invention provides optical alignment that is highly tolerance of vibrations in the experimental set up.

Conformal contact may be provided by bring at least a portion of the mask element (or a coating thereon) and the radiation sensitive material undergoing processing close enough together such that attractive intermolecular forces, such as Van der Waals forces, dipole-dipole forces, hydrogen bonding and London forces, are established which bind the two elements. "Conformal contact" refers to contact established between surfaces and/or coated surfaces, which may be useful for fabricating establishing an maintaining optical alignment of a mask element and a radiation sensitive material. In one aspect, conformal contact involves a macroscopic adaptation of one or more contact surfaces of a mask element, such as a phase mask, to the overall shape of a surface of a radiation sensitive material, for example a flat, smooth, rough, contoured, convex or concave surface of a radiation sensitive material undergoing processing. In another aspect, conformal contact involves a microscopic adaptation of one or more contact surfaces of a mask element, such as a phase mask, to the overall shape of a surface of a radiation sensitive material, leading to an intimate contact without voids. The term conformal contact is intended to be consistent with use of this term in the art of lithography and materials science.

In one embodiment, mask elements of the presenting invention are capable of establishing conformal contact with one or more flat surfaces of a radiation sensitive material undergoing processing. Alternatively, mask elements of the presenting invention are also capable of establishing conformal contact with one or more contoured surface of a radiation sensitive material undergoing processing, such as a curved surface, convex surface, concave surface or surface having ridges, channels or other relief features thereon. Use of a mask element comprising a flexible, low modulus and high elasticity material, such as an elastomer, is beneficial for fabricating 3D structures on contoured surfaces because such materials are capable of conforming to at least a portion of the surface features of the radiation sensitive materials undergoing processing. Conformal contact may be established between one or more bare contact surfaces of a mask element, such as a phase mask, and one or more surfaces of a radiation sensitive material. Alternatively, conformal contact may be established between one or more coated contact surfaces of a mask element, such as a phase mask, and one or more surfaces of a radiation sensitive material. Use of mask elements comprising elastomers and composite multilayer structures having elastomeric components is particularly useful in some applications for establishing conformal contact with a wide range of radiation sensitive materials.

Exemplary optical alignment schemes include configurations providing for conformal contact between a plurality of discontinuous contact surfaces corresponding to relief features of a mask element, such as a phase mask, and a surface of a radiation sensitive material. Alternatively, the present invention includes optical alignment schemes wherein a single, continuous contact surface corresponding to relief features of a mask element, such as a phase mask, is in conformal contact with the surface of a radiation sensitive material. In the present invention, contact surfaces of mask elements and radiation sensitive materials may also possess specific relief patterns, such as complementary alignment channels and/or grooves, useful for providing a selected alignment between a mask element and surface of a radiation sensitive material undergoing processing. As will be understood by a person of ordinary skill in the art, use of such "lock and key" alignment mechanisms, channels, grooves and systems are well known in the art of microfabrication and nanofabrication, and may easily be integrated into mask elements of the present invention. Use of alignment mechanisms comprising alignment channels and/or grooves is beneficial for providing 3D structures on substrate surfaces or integrating 3D structures into devices with good placement accuracy. Use of alignment mechanisms is also beneficial for minimizing deviations in the placement of 3D structures on surfaces (or in devices) due to thermal expansion and/or thermal contraction.

The present invention includes methods and devices employing a parallel optical alignment of contact surfaces of mask elements and radiation sensitive materials. Alternatively, the present invention includes methods and devices employing a non-parallel alignment of contact surfaces of mask elements and radiation sensitive materials. In an exemplary embodiment, a wedge, bevel, spacer or any equivalent thereof may be provided between the mask element and the radiation sensitive material to provide a selected nonparallel orientation. Alternatively, the present invention includes optical alignment provided by an external optical alignment system capable of holding the mask element and the radiation sensitive material in a well characterized relative orientation.

In an exemplary embodiment, optical alignment of the mask element and the radiation sensitive material is held constant throughout the entire period of exposure to electromagnetic radiation. Use of mask elements comprising materials capable of establishing good conformal contact with a surface of a radiation sensitive material, such as an elastomeric phase mask, is particularly beneficial for maintaining a constant vertical and lateral optical alignment of thee elements throughout the entire period of photoprocessing. However, the present invention also includes methods and devices wherein the optical alignment of the mask element and the radiation sensitive material is selectively adjusted (or tuned) during fabrication to achieve an optimized 3D structure having physical dimensions and compositions selected with great accuracy.

The methods of fabricating 3D structures of the present invention use substantially coherent electromagnetic radiation. In the context of the present invention the term "substantially coherent electromagnetic radiation" refers to electromagnetic radiation having a coherence length that is greater than or equal to the thickness of the structural features, such as nanoscale features, comprising 3D structures fabricated by the methods and devices of the present invention. It is preferred for some applications of the present invention that substantially coherent electromagnetic radiation is characterized by a coherence length that is at least about 10 times greater than the thickness of the structural features, such as nanoscale features, comprising 3D structures fabricated by the methods and devices of the present invention. In one embodiment, "substantially coherent electromagnetic radiation" refers to electromagnetic radiation having a coherence length that is greater than or equal to the thickness of the radiation sensitive material undergoing processing, preferably for some applications greater than about 10 times the thickness of the radiation sensitive material undergoing processing. In the context of this description, the "thickness of the radiation sensitive material" correspondences to the physical dimension of a layer of radiation sensitive material that extends along an axis parallel to the propagation axis of the beam of electromagnetic radiation. Substantially coherent electromagnetic radiation may be characterized in terms of temporal coherence and spatial coherence. Substantially coherent electromagnetic radiation useful for some applications of the present invention is characterized by a temporal coherence length equal to or greater than about 100 microns. Substantially coherent electromagnetic radiation useful for some applications of the present invention is characterized by a spatially coherent beam of electromagnetic radiation.

Temporal coherence length is inversely related to the bandwidth of a given beam of electromagnetic radiation and may be expressed in terms of bandwidth by the equation:

$$\text{temporal coherence length} = \lambda_{center} \times \left( \frac{\lambda_{center}}{(\pi)(\Delta\lambda)} \right) \quad (I)$$

wherein $\lambda_{center}$ is center wavelength and $\Delta\lambda$ is the bandwidth of the beam of electromagnetic radiation. Therefore, it is useful in some contexts to characterize the electromagnetic radiation useful for the methods and devices of the present invention in terms of bandwidth. Beams of electromagnetic radiation characterized by a narrow bandwidth, such as a beam having a center wavelength equal to about 365 nm and a full width at half maximum (FWHM) bandwidth equal to or less than about 4 nm, provide substantially coherent electromagnetic radiation useful for the methods and devices of the present invention.

The present invention also includes embodiments wherein the spatial coherence, temporal coherence or both of electromagnetic radiation is selected (or selectively adjusted) to control the spatial distribution and/or density of structural features in 3D structures fabricated by the present methods. In some embodiments, the spatial and/or temporal coherence is selected to control the size of a region of a 3D structure wherein nanoscale and/or microscale features are localized. For example, the present invention comprises fabrication methods wherein the spatial and/or temporal coherence of the beam of electromagnetic radiation is selected to control the size of a region proximate to the interface between a mask element and the radiation sensitive material wherein 3D features are localized. This aspect of the present invention is particularly useful for fabricating 3D structures having a plurality of nanoscale features that are only partially distributed through the photosensitive material, for example localized to the contact surface of a radiation sensitive material. 3D structures fabricated by the present methods comprising a plurality of nanoscale features only partially distributed through the photosensitive material have mechanical properties, such as structural robustness, well suited for some device applications, and also allow for effective integration of these structures into a range of device configurations. The beneficial structural properties of 3D structures fabricated by such coherence tuning methods arise from the continuous interface between the region comprising a plurality of nanoscale features and the underlying solid region.

Sources of electromagnetic radiation useful in the present invention include any source of electromagnetic radiation capable of providing a substantially coherent beam of electromagnetic radiation. Exemplary sources of electromagnetic radiation useful in the present invention include narrow bandwidth sources of electromagnetic radiation such as a low pressure mercury lamp, zinc lamp, light emitting diode sources of electromagnetic radiation or laser sources. In the context of this description, the term "narrow bandwidth source of electromagnetic radiation" refers to a source of electromagnetic radiation having a bandwidth which provides for electromagnetic radiation having a coherence length, spatial coherence and/or temporal coherence length such that the electromagnetic radiation is usable in the methods of the present invention without additional optical filtering. An exemplary narrow bandwidth source of electromagnetic radiation usable in the methods of the present invention is a source of electromagnetic radiation having a center wavelength of 365 nm and a bandwidth of 4 nm. As will be readily understood by a person having skill in the art, bandwidth requirements for narrow bandwidth sources of electromagnetic radiation will vary with center frequency, the physical dimensions of the 3D structures generated and/or the thickness of the radiation sensitive material. Narrow bandwidth sources of electromagnetic radiations may also be used in the methods of the present invention in combination with one or more filters including, but not limited to, Fabry-Perot filters, cut-off filters, polarization filters, wave plates, neutral density filters, attenuation filters or any combination of these.

Alternatively, the present invention may be practiced using sources of electromagnetic radiation comprising one or more broad bandwidth source of electromagnetic radiation such as a fluorescent lamps, blackbody sources of electromagnetic radiation, xenon lamps, quartz lamps or deuterium lamps; in combination with one or more optical filters, such as a Fabry-Perot etalon or combination of high pass and low pass filters. In the context of this description, the term "broad bandwidth source of electromagnetic radiation" refers to sources of electromagnetic radiation having a bandwidth which provides for electromagnetic radiation having a coherence length, spatial coherence and/or temporal coherence length such that the electromagnetic radiation is not usable in the methods of the present invention without additional optical filtering. In one aspect of the present invention, use of optical filters provides a bandwidth of transmitted electromagnetic radiation that provides the coherence required to practice the methods of the present invention. Broad bandwidth sources electromagnetic radiation sources may be used in the methods of the present invention in combination with one or more filters including, but not limited to, Fabry-Perot filters, cut-off filters, polarization filters, neutral density filters, attenuation filters or any combination of these.

Pulsed sources of electromagnetic radiation or continuum sources of electromagnetic radiation are usable in the methods and devices of the present invention. In some embodiments, pulsed sources of electromagnetic radiation having pulse durations ranging from femtoseconds to microseconds are used to provide full temporal overlap of beams of electromagnetic radiation due to the conformal contact established between the mask element and radiation sensitive material undergoing processing. In these embodiments, the depth of temporal overlap is a function of pulse duration. Simple calculations show a temporal overlap up to 10 s of microns is generated when a 100 femtosecond pulse duration source is used in the methods of the present invention. This aspect of the present invention differs from conventional all interference techniques, which do not provide for conformal contact. Non-laser sources of electromagnetic radiation are preferred for some applications due to their low cost, long operating lifetimes and relative ease of alignment. Exemplary sources of electromagnetic radiation of the present invention generate electromagnetic radiation having a distribution of wavelengths that is at least partially absorbed by a given radiation sensitive material, preferably electromagnetic radiation in the ultraviolet, visible and/or infrared regions of the spectrum. Exemplary sources of electromagnetic radiation illuminate a spot size which is larger than the thickness the radiation sensitive material and/or the thickness of the structure to be fabricated, preferably 5 to 10 times larger. In this context, the term "spot size" refers to the illuminated area of the mask element. An exemplary embodiment of the present invention uses a substantially coherent beam of electromagnetic radiation having a spot size with an area equal to or greater than 0.75 mm$^2$.

Substantially coherent electromagnetic radiation having any wavelength capable of generating chemically modified and/or physically modified regions of a radiation sensitive material is usable in the present invention. In some useful embodiments, substantially coherent electromagnetic radiation is used that is capable of initiating polymerization reactions, such as cross linking reactions, in a photopolymer material undergoing processing. Polymerization reactions may be photoinduced in the present invention by single photon absorption processes and/or multiphoton absorption processes. Methods of the present invention using multiphoton absorption processes may be desirable for processing materials that do not transmit significantly in the ultraviolet region of the spectrum because such multiphoton absorption processes can typically be driven by visible and near infrared electromagnetic radiation. In addition, multiphoton absorption methods of the present invention provide enhanced resolution of features in some embodiments because the intensities of electromagnetic radiation that are large enough to induce significant multiphoton absorption in a radiation sensitive material are narrowly localized to a region about the maxima in an intensity distribution of an optical interference pattern generated by a mask element. Furthermore, use of multiphoton processes increases the flexibility of the present methods because it allows a wider range of wavelengths of electromagentic radiation to be used during processing. For example, use of two photon processes with a conventional photosensitive materials typically used for one photon photoprocessing allows wavelengths of electromagnetic radiation as large as 1200 nm wavelength to be used for patterning. This capability has particular importance for fabrication of photonic bandgap materials because the photonic bandgap is a function of lattice parameter of a certain 3D structure, which is directly proportional to the exposure wavelength employed during processing. Consequently, compatibility with multiphoton processing provides the present methods with greater flexibility in tailoring a selected bandgap at certain wavelengths.

Mask elements usable in the present invention comprise any optical component, optical device or combination of optical components and devices that are capable of providing optical interference patterns having well defined, selected spatial distributions of electromagnetic radiation intensities, states of polarization, amplitudes and phases. Upon exposure to one or more beams of substantially coherent electromagnetic radiation, exemplary mask elements of the present invention generate a plurality of beams of substantially coherent electromagnetic radiation which undergo optical interference in a radiation sensitive material, thereby forming an optical interference pattern having selected spatial distributions of intensities and polarization states. Mask elements may comprise a single optical element, such as an elastomeric phase mask having a selected relief pattern, or may comprise a plurality of optical elements. Mask elements of the present invention may provide transmitted and/or reflected electromagnetic radiation which generates a desired 3D interference pattern within a radiation sensitive material.

In one embodiment, the mask element comprises a diffraction grating capable of generating a plurality of discrete beams of electromagnetic radiation corresponding to different diffraction orders, which undergo optical interference in a radiation sensitive material. In another embodiment, the mask element comprises a phase mask having a selected relief pattern that is capable of generating a plurality of beams of electromagnetic radiation propagating along different propagation axes, which undergo optical interference within a radiation sensitive material. In one embodiment of this aspect of the present invention, external surfaces of the relief pattern of the phase mask comprise contact surfaces capable of establishing and maintaining conformal contact with specific portions of the contact surface of the radiation sensitive material undergoing processing. Relief patterns may be characterized in terms of the physical dimensions and periodicity of the relief features. In one embodiment, relief features of a phase mask of the present invention have thicknesses (i.e. dimensions extending along an axis parallel to the propagation axis of the electromagnetic radiation incident on the mask element), lengths (i.e. dimensions extending along axes orthogonal to the propagation axis of the electromagnetic radiation) and/or periodicities (i.e. spacing between relief features) that are comparable to the wavelength of the electromagnetic radiation used for processing. Exemplary relief patterns of phase masks of the present invention have physical dimensions on the order of 120 nm to about 5000 nm, preferably on the order of about 100 nm to about 800 nm. Mask elements of the present invention may have relief patterns comprising symmetrical patterns of relief features or asymmetrical patterns of relief features, such as relief patterns having one or more controlled defect sites.

In one aspect of the present invention, the mask element comprises a phase mask comprising one or more polymer layers. In one embodiment, for example, the mask element comprises an elastomeric phase mask, such as a polydimethylsiloxane (PDMS) phase mask. Use of a phase mask comprising a polymeric material having a low modulus and high elasticity, such as an elastomeric material, is beneficial because its intrinsic flexibility allows for good optical alignment of the mask element and the radiation sensitive material, such as the alignment provided by conformal contact of the mask element and the radiation sensitive material. In one embodiment, a phase mask having a Young's modulus selected from the range of about 0.1 MPa to about 100 MPa is employed in the present methods. Exemplary elastomeric phase masks of this aspect of the present invention comprise conformable, rubber phase masks, such as a PDMS phase mask, having a relief pattern comprising a plurality of relief features having one or more selected physical dimensions comparable to the wavelength of the light passed through the phase mask. Alternatively, the present invention includes methods using phase masks comprising materials having a high modulus, particularly in the form of a thin sheet of material which exhibits some degree of flexibility along one or more dimensions.

Exemplary phase masks useful in the present methods include single layer elastomeric phase masks comprising a polymer layer having a low Young's Modulus, such as a poly(dimethylsiloxane) (PDMS) layer, preferably for some applications having a thickness selected from the range of about 1 micron to about 100 microns. Alternatively, phase masks of the present invention comprise composite, multilayer phase masks, such as those described in U.S. Patent Application Ser. No. 60/565,604, entitled "Composite Patterning Devices for Soft Lithography," filed with the U.S. Patent and Trademark Office on Apr. 27, 2004, which is hereby incorporated by reference in its entirety. An exemplary composite multilayer phase mask usable in the methods of the present invention comprises a first polymer layer having a low Young's modulus and high elasticity, such as a PDMS layer, and a second polymer layer having a high Young's modulus. In this embodiment, the internal surface of the first polymer layer and the internal surface of the second polymer layer are arranged such that a force applied to the external surface of the second polymer layer is transmitted to the first polymer layer. Use of a high modulus second polymer layer in composite multilayer phase masks of the present invention is beneficial because it provides phase masks having a net flexural rigidity large enough prevent relief pattern distortion when positioned in conformal contact with the surfaces of radiation sensitive materials undergoing processing. For example, use of a phase mask having a net flexural rigidity selected from the range of about $1\times10^{-7}$ Nm to about $1\times10^{-5}$ Nm minimizes distortions in the positions and physical dimensions of relief features of the phase mask upon establishing conformal contact with a surface of a radiation sensitive material undergoing processing.

Radiation sensitive materials usable in the methods and devices of the present invention include any material which undergoes a chemical and/or physical change upon exposure to electromagnetic radiation. Radiation sensitive materials of the present invention may be solids, liquids, or colloidal materials such as gels, sols, emulsions, and foams. Exemplary radiation sensitive materials include, but are not limited to, materials which undergo photopolymerization upon absorption of electromagnetic radiation, such as photopolymerizable precursors. Radiation sensitive materials also include, but are not limited to, materials that become susceptible or insusceptible to chemical etching upon absorption of electromagnetic radiation. Radiation sensitive materials also include, but are not limited to, materials that become soluble or insoluble to chemical reagents, such as solvents, upon absorption of electromagnetic radiation. Materials which act as a negative photoresist, such as SU8 from Microchem Corp., may be used as radiation sensitive materials of the present invention. Alternatively, materials which act as a positive photoresist may be used as radiation sensitive materials of the present invention. Exemplary radiation sensitive materials useful in the methods of the present invention include, but are not limited to, photopolymers, such as polyurethane based systems and different classes of epoxy novolac materials. Exemplary electromagnetic radiation sensitive materials also include, but are not limited to, materials comprising one or more photoinitiators, which are capable of initiating chemical or physical changes in a radiation sensitive material upon absorption of electromagnetic radiation.

In an exemplary embodiment, the radiation sensitive material is in contact with and/or supported by a substrate. Use of a transparent substrate is preferred for some applications of the present invention because it minimizes unwanted back reflections of the beam of electromagnetic radiation passed through the mask element which can affect the intensity distribution of the optical interference pattern generated within the radiation sensitive material. However, the methods of the present invention may be used to fabricate 3D structures and patterns of 3D structures on a wide variety of substrates including highly or partially reflective substrates and/or high or partially absorbing substrates.

The methods of the present invention are capable of fabricating 3D structures comprising features, such as nanoscale features, having a wide variety of physical dimensions and relative spatial arrangements. The present methods are capable of fabricating symmetrical or asymmetric patterns comprising a plurality of discrete 3D structures having nanoscale features. Alternatively, the present methods are capable of fabricating unitary 3D structures comprising symmetrical or asymmetric patterns of nanoscale features. For example, the present invention is capable of fabricating asymmetric patterns of discrete 3D structures having nanoscale features or unitary 3D structures comprising asymmetric patterns of nanoscale features characterized by one or more controlled defect sites.

Fabrication methods of the present invention provide control of lateral and vertical dimensions of features of the 3D structures fabricated. Exemplary 3D structures fabricated by the present methods include, but are not limited to, 3D structures having features with selected lateral and vertical dimensions. The ability to fabricate structures having selected vertical dimensions is a significant advantage of the methods of the present invention over conventional lithographic fabrication methods. The methods of the present invention are capable of fabricating 3D structures having features with vertical and/or lateral dimensions selected from about 20 nanometers to about 5000 of nanometers. 3D nanostructured structures and films with thicknesses up to 100 μm can be achieved by the present methods; and only the structural integrity and optical absorption of the radiation sensitive material limit this thickness.

In one embodiment, the present invention provides methods of making 3D structures having a plurality of chirped features and methods of making patterns of chirped 3D structures on a substrate surface. In the context of this description, the term "chirped features" or "chirped structures" refers to patterns of features or structures having continuously varying periodicities. In one embodiment, a conformable, elastic phase mask, such as a PDMS phase mask, having a relief pattern comprising a substantially symmetric distribution of relief features is physically deformed, for example by expansion (i.e. stretching) or compression, during or before establishing conformal contact with the radiation sensitive material undergoing processing. Physical deformation of the phase mask changes the relative orientation of relief features in the relief pattern, thereby generating a chirped distribution of relief features. Exposure to electromagnetic radiation while maintaining the physically deformed orientation of the phase mask substantially constant results in fabrication of one or more 3D structures or patterns of 3D structures having a chirped distribution. Alternatively, patterns comprising chirped 3D structures or features may be fabricated by present methods using of a phase mask having a relief pattern comprising a pattern of chirped features when it is not in a deformed state. An exemplary application of chirped structure is building point, line, planar or even 3D defect structure inside a photonic bandgap material. This can be a photon trap, zero loss waveguide even in sharp angle bending, perfect mirror, which are key components of full photonic device.

The present invention provides high resolution fabrication methods allowing accurate control over the physical dimensions of features comprising 3D structures, in some cases features with physical dimensions as small as 20 nanometers. Resolution limits of the present techniques arise from several sources including the size of monomer consisting photopolymer, roughness of the radiation sensitive material, crosslinking radius (i.e. diffusion length of crosslinking chain reaction), exposure wavelength, polarization state and material response to the polarization, and resolution of phase mask. In some embodiments, fabrication methods of the present invention use multiphoton absorption initiated polymerization reactions in radiation sensitive materials which provide 3D structures having features exhibiting enhanced high resolution in geometric proportion to number of photon involved in the excitation of the radiation sensitive material.

The present methods provide low cost, high throughput methods for fabricating and/or patterning 3D structures on large areas of substrate surfaces. Only the spot size of the source of electromagnetic radiation and the size of the phase mask limit the size of the substrate areas patterned by the present methods. The present methods are capable of patterning large areas of a substrate or device with a plurality of independent 3D structures having at least one nanoscale feature. Alternatively, the present invention is capable of patterning large areas of a substrate or device with a unitary 3D structure, such as a film, comprising a pattern of features having nanoscale physical dimensions.

The present fabrication methods are flexible methods that are complementary with a range of conventional microfabrication and nanofabrication techniques, such as micromolding, embossing and etching techniques. In one aspect the present invention provides maskless lithographic fabrication methods. In this embodiment, a patterning element is used as to directly mold or emboss relief features into a surface of the radiation sensitive material undergoing processing. Relief features may be introduced to the radiation sensitive materials using any means capable of appropriate manipulation of the radiation sensitive material including, but not limited to, bringing a phase mask of the present invention having a plurality of relief features or equivalent patterning device into contact with a surface of the radiation sensitive material. Alternatively, relief features may be introduced by repeatedly bringing a translatable indentation tool, such as a rod or bar, into contact with different regions of a surface of the radiation sensitive materials, thereby fabricating the appropriate relief structure. In this embodiment, the radiation sensitive material is molded when in a physically deformable state, for example at a temperature near its glass point temperature, by providing physical contact with the patterning element. Next, the radiation sensitive material itself is exposed to electromagnetic radiation, thereby generating chemically or physically modified regions throughout the molded regions and, optionally, unmolded regions. Subsequent developing of the chemically and/or physically modified radiation sensitive material results in fabrication of a wide range of structures. Therefore, the portion of the radiation sensitive material itself having relief features functions as a phase mask for generating a plurality of beams which generate an optical interference pattern corresponding to a desired 3D structure within the radiation sensitive material. The present invention also includes fabrication methods wherein a radiation sensitive material having a selected relief pattern is brought into optical communication with a mask element during photoprocessing. In this embodiment, both the mask element and the portion of the radiation sensitive material itself having relief features functions as a phase mask for generating an optical interference pattern corresponding to a desired 3D structure within the radiation sensitive material. Molding or embossing prior to exposure to electromagnetic radiation using a phase mask comprising a relief pattern having a combination of nanometer and micron scale physical dimensions is useful for making 3D structures with both nanometer and micron scale features. The micron scale features of such structures allows for easily integrated into micron and millimeter scale elements, such as couplers, waveguides and other devices, whereas the nanoscale feature may provide the functionality of the 3D structure, such as a filtering, photonic/phonic properties or fluid mixing capabilities.

In another aspect, the present invention provides a method for making a 3D structure, comprising the steps of: (1) providing a substantially coherent beam of electromagnetic radiation; (2) directing the substantially coherent beam of electromagnetic radiation onto a mask element in direct optical communication with a radiation sensitive material; thereby generating a optical interference pattern within the radiation sensitive material; wherein interactions of the electromagnetic radiation with the radiation sensitive material generates chemically modified regions of the radiation sensitive material, (3) removing at least a portion of the chemically modified regions of the radiation sensitive material or removing the radiation sensitive material which is not chemically modified, thereby generating the 3D structure.

In another aspect, the present invention comprises methods for assembling a 3D structure within a device comprising the steps of: (1) providing a substantially coherent beam of electromagnetic radiation; and (2) directing the substantially coherent beam of electromagnetic radiation onto a mask element in direct optical communication with a radiation sensitive material positioned within the device; thereby generating a optical interference pattern within the radiation sensitive material within the device; wherein interactions of the electromagnetic radiation with the radiation sensitive material generates chemically modified regions of the radiation sensitive material; (3) removing at least a portion of the chemically modified regions of the radiation sensitive material or removing at least a portion of the radiation sensitive material which is not chemically modified, thereby generating the 3D structure.

In another aspect, the present invention comprises a methods for making a 3D structure, comprising the steps of: (1) providing a radiation sensitive material; (2) generating a relief pattern on the radiation sensitive material; (3) providing a substantially coherent beam of electromagnetic radiation; (4) directing the substantially coherent beam of electromagnetic radiation onto the relief pattern; wherein the relief pattern generates a plurality of beams of electromagnetic radiation, thereby generating a optical interference pattern within the radiation sensitive material; wherein interactions of the electromagnetic radiation with the radiation sensitive material generates chemically modified regions of the radiation sensitive material; and (5) removing at least a portion of the chemically modified regions of the radiation sensitive material or removing at least a portion of the radiation sensitive material which is not chemically modified, thereby generating the 3D structure.

In another aspect, the present invention comprises methods for making a 3D structure, the method comprising the steps of: (1) generating a substantially coherent beam of electromagnetic radiation; (2) selecting the spatial coherence, temporal coherence or both of the coherent beam of electromagnetic radiation; (3) directing the substantially coherent beam of electromagnetic radiation onto a mask element in optical communication with a radiation sensitive material; thereby generating a optical interference pattern within the radiation sensitive material; wherein interactions of the electromagnetic radiation with the radiation sensitive material generates chemically modified regions of the radiation sensitive material; and (4) removing at least a portion of the chemically modified regions of the radiation sensitive material or removing at least a portion of the radiation sensitive material which is not chemically modified, thereby generating the 3D structure.

The present invention is further illustrated by the following description, examples, drawings and claims.

BRIEF DESCRIPTION OF THE DRAWINGS

FIGS. 6A-H provide scanning electron micrographs and optical micrographs of a 3D nanostructure built into the channel of a microfluidic system using the methods of the present invention.

FIGS. 7A-L present scanning electron micrographs and computed intensity distributions for a broad range of periodic structures that may be fabricated using the methods and devices of the present invention.

FIGS. 8A-L present scanning electron micrographs, computed intensity distributions and confocal micrographs (Leica SP2) illustrating the geometry of an aperiodic structure made with a specially designed conformable phase mask of the present invention.

FIGS. 13A-D provides scanning electron micrographs of structures fabricated using the present methods. FIG. 13A shows a structure fabricated using Mask 1 of example 5 exposed to electromagnetic radiation having a wavelength of 355 nm. FIG. 13B shows a structure fabricated using Mask 2 of example 5 exposed to electromagnetic radiation having a wavelength of 514 nm. FIGS. 13C and 13D show a structure fabricated using Mask 3 of example 5 exposed to electromagnetic radiation having a wavelength of 810 nm.

FIGS. 16 A-C illustrate useful structures and steps in a method of the present invention using micromolding to generate a multilayer phase mask for photoprocessing a radiation sensitive material.

DETAILED DESCRIPTION OF THE INVENTION

Figure 1A:
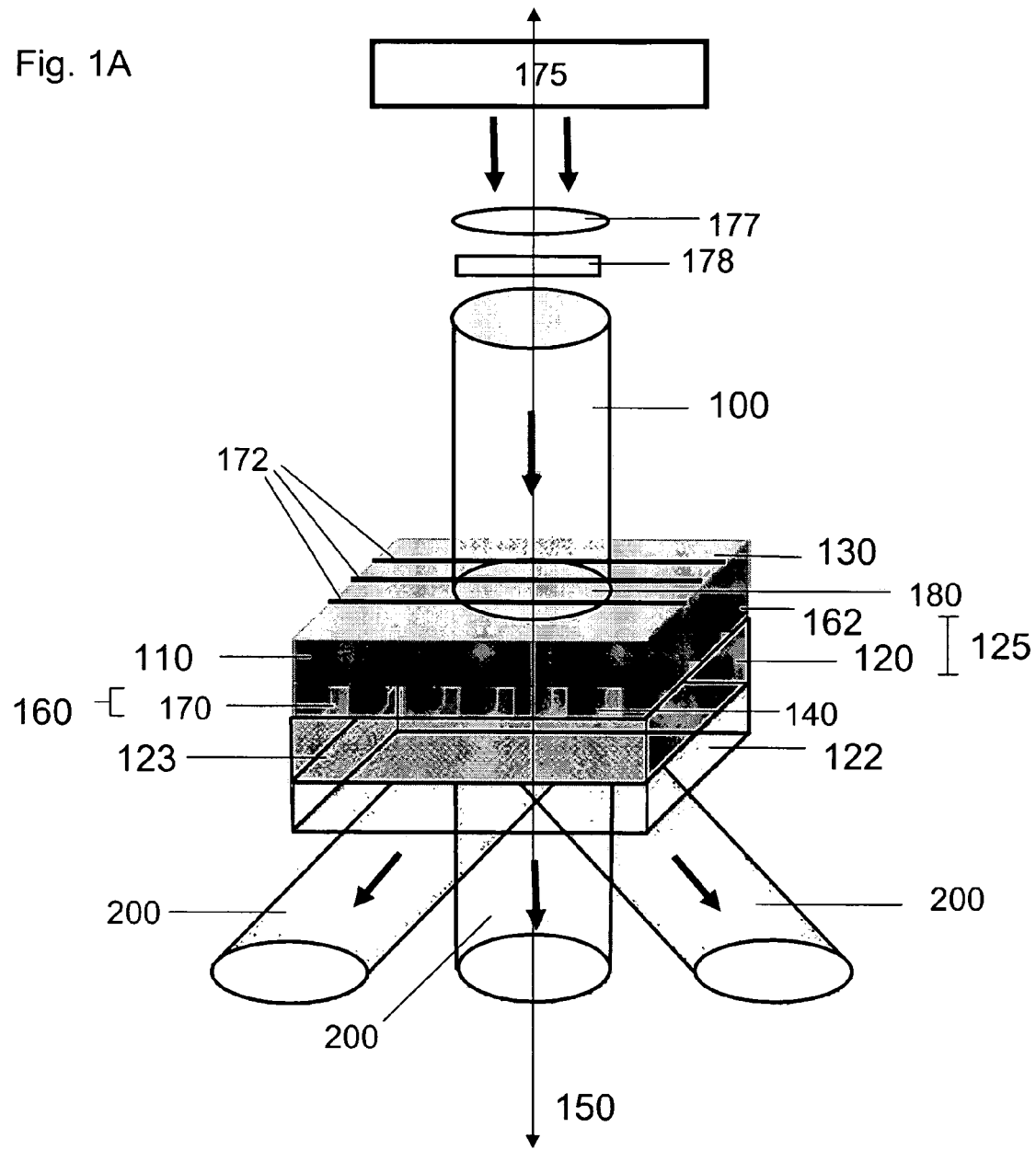
FIG. 1A is a schematic drawing illustrating an exemplary method and device for fabricating 3D nanoscale structures using optical interference patterns.

Referring to the drawings, like numerals indicate like elements and the same number appearing in more than one drawing refers to the same element. In addition, hereinafter, the following definitions apply:

The term "electromagnetic radiation" refers to waves of electric and magnetic fields. Electromagnetic radiation useful for the methods of the present invention includes, but is not limited to, gamma rays, X-rays, ultraviolet light, visible light, infrared light, microwaves, radio waves or any combination of these. The methods and devices of the present invention use beams of substantially coherent electromagnetic radiation which may be characterized in terms of a distribution of intensities corresponding to a range of wavelengths. Beams of substantially coherent electromagnetic radiation of the present invention may be characterized by any intensity distribution, including but not limited to Gaussian distributions, Lorentzian distributions or any combination of these. Beams of substantially coherent electromagnetic radiation of the present invention may be characterized in terms of coherence length, spatial coherence, temporal coherence length, bandwidth, center wavelength or any combination of these properties.

"Optical thickness" refers to the product of the thickness and the refractive index of a layer and may be expressed by the equation:

$$\text{optical thickness} = (L)(n); \quad (II)$$

where L is the physical thickness and n is the refractive index.

The terms "intensity" and "intensities" refers to the square of the amplitude of an electromagnetic wave or plurality of electromagnetic waves. The term amplitude in this context refers to the magnitude of an oscillation of an electromagnetic wave. Alternatively, the terms "intensity" and "intensities" may refer to the time average energy flux of a beam of electromagnetic radiation or plurality of beams of electromagnetic radiation, for example the number of photons per square centimeter per unit time of a beam of electromagnetic radiation or plurality of beams of electromagnetic radiation. The term "3D structure" refers to a structure comprising one or more structural features occupying space in three dimensions. In one aspect, the methods and devices of the present invention generate one or more 3D structures characterized by structural features, such as nanoscale features, having selectable lengths in one-dimension, two-dimensions or three-dimensions. 3D structures generated by the methods of the present invention may be characterized by features having selectable physical dimensions along an axis corresponding to the thickness of the radiation sensitive material. Alternatively, 3D structures generated by the methods of the present invention may be characterized by features having selectable physical dimensions along an axis or plurality of axes which are parallel to the propagation axis or propagation axes of substantial coherent electromagnetic radiation incident to a mask element. Alternatively, 3D structures generated by the methods of the present invention may be characterized by features having selectable physical dimensions along an axis or plurality of axes which are parallel to the propagation axis or axes of electromagnetic radiation reflected by a mask element. Alternatively, 3D structures generated by the methods of the present invention may be characterized by features having selectable physical dimensions along an axis or plurality of axes which are parallel to the propagation axis or axes of electromagnetic radiation scattered by a mask element. In the context of this discussion, lengths and/or physical dimensions of 3D structures fabricated by the methods of the present invention are selectable by selection of the physical dimensions and/or optical properties of the mask element.

"Feature" refers to a structural element of a 3D structure. The present invention provides methods of making patterns comprising a plurality of independent 3D structures each of which having at least one nanoscale feature. In addition, the present invention provides methods of making a unitary 3D structure comprising a pattern of nanoscale features. The term "nanoscale feature" refers to feature of a structure that exhibits at least one physical dimension, such as a lateral or vertical dimension, having values selected from the range of values of about 10 nm to about 100,000 nm, and more preferably selected from the range of values of about 100 nm to about 50,000 nm.

The term "physical dimension" or "dimension" refers to a physical characteristic of a structure, feature of a structure or pattern of structures or features that characterizes how the structure, features or pattern of structures or features is oriented in two or three dimensions and/or occupies space. Physical dimensions of structures, features of structures or patterns of structures or features include, length, width, height, depth, radius, radius of curvature and periodicity. Vertical dimensions of 3D structures correspond to dimensions extending along an axis that is parallel to the propagation axis of the incident beam of substantially coherent radiation directed onto the mask element. Lateral dimensions of 3D structures correspond to dimensions extending along axes that are orthogonal to the propagation axis of the incident beam of substantially coherent radiation directed onto the mask element. Structures and features of structures having a wide variety of shapes may be characterized in terms of their physical dimensions, including but not limited cubes, rectangular solids, columns, posts, ribbons and other shapes comprising combinations of these. Lateral dimensions of relief features of phase masks of the present invention include dimensions that extend along axes orthogonal to the propagation axis of the incident beam of electromagnetic radiation. The present invention provides methods, devices and device components for fabricating 3D structures having accurately selected physical dimensions, such as 3D structures comprising a plurality of features each of which having selected physical dimensions.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, PDMS, h-PDMS, polybutadiene, polyisobutylene, poly(styrene-butadiene-styrene), polyurethanes, polychloroprene and silicones.

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad (II)$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad (III)$$

wherein $\lambda$ and $\mu$ are Lame constants. Young's modulus may be expressed in units of force per unit area, such as Pascal (Pa=N m$^{-2}$).

High Young's modulus (or "high modulus") and low Young's modulus (or "low modulus") are relative descriptors of the magnitude of Young's modulus in a given material, layer or device. In the present invention, a High Young's modulus is larger than a low Young's modulus, preferably about 10 times larger for some applications, more preferably about 100 times larger for other applications and even more preferably about 1000 times larger for yet other applications. In one embodiment, a material having a high Young's modulus has a Young's modulus selected over the range of about 1 GPa to about 10 GPa and a material having a low Young's modulus has a Young's modulus selected over the range of about 0.1 MPa to about 100 MPa.

The term "thickness of radiation sensitive material" refers to the thickness of the radiation sensitive material along an axis substantially parallel to the propagation axis of the electromagnetic radiation directed onto the mask element.

"Optical communication" refers to a configuration of two or more elements wherein one or more beams of electromagnetic radiation are capable of propagating from one element to the other element. Elements in optical communication may be in direct optical communication or indirect optical communication. "Direct optical communication" refers to a configuration of two or more elements wherein one or more beams of electromagnetic radiation propagate directly from a first device element to another without use of optical components for steering and/or combining the beams, such as a focusing lens. In one useful embodiment, for example, a mask element of the present invention is in direct optical communication with a radiation sensitive material such that a plurality of beams of electromagnetic radiation generated by the mask element are directed onto the radiation sensitive material, are combined and undergo optical interference within the radiation sensitive material without use of additional optics for recombining the beams generated by the mask element, such as focusing lenses or reflectors. "Indirect optical communication" on the other hand refers to a configuration of two or more elements wherein one or more beams of electromagnetic radiation propagate between two elements via one or more device components including, but not limited to, wave guides, fiber optic elements, reflectors, filters, prisms, lenses, gratings and any combination of these device components.

"Beam of electromagnetic radiation" refers to electromagnetic radiation propagating in the same direction. In the present description, use of the term beam of electromagentic radiation is intended to be consistent with use of this term in the art of optics and spectroscopy. Beams of electromagnetic radiation useful in the methods of the present invention include substantially coherent beams of electromagnetic radiation, pulses of electromagnetic radiation and continuous wave beams of electromagnetic radiation. Beams of electromagnetic radiation useful in some applications comprise photons having substantially parallel propagation axes. In this context the term "parallel" refers to a geometry in which two axes are equidistant from each other at all points and the term "substantially parallel" is intended to refer to a geometry including some deviations from absolute parallelism. Beams of electromagnetic radiation useful in the present methods may be focusing, diverging, collimated, semicollimated or noncollimated.

In the following description, numerous specific details of the devices, device components and methods of the present invention are set forth in order to provide a thorough explanation of the precise nature of the invention. It will be apparent, however, to those of skill in the art that the invention can be practiced without these specific details.

FIG. 1A is a schematic drawing illustrating a method and device of the present invention for fabricating 3D nanoscale structures or patterns of 3D nanoscale structures on a substrate surface. As shown in FIG. 1A, a substantially coherent beam of electromagnetic radiation 100 is directed onto a phase mask 110 in optical communication with a radiation sensitive material 120 of selected thickness 125 along incident beam propagation axis 150. In the embodiment shown in FIG. 1A, phase mask 110 is in direct optical communication with a radiation sensitive material 120, such that a plurality of beams of electromagnetic radiation propagating along different propagation axes are generated by the phase mask 110, and are combined and undergo optical interference within radiation sensitive material 120 without passage of the beams generated by the mask element through any additional optics, such as a focusing lens, for steering or combining the beams. Radiation sensitive material 120 is positioned between phase mask 110 and substrate 122. In a useful embodiment, radiation sensitive material 120 is supported by substrate 122, and the present methods provide a means of patterning external surface 123 of substrate 122 with 3D structures or a means of patterning external surface 123 of substrate 122 with a film comprising one or more unitary 3D structures having a plurality of features.

Figure 1B:
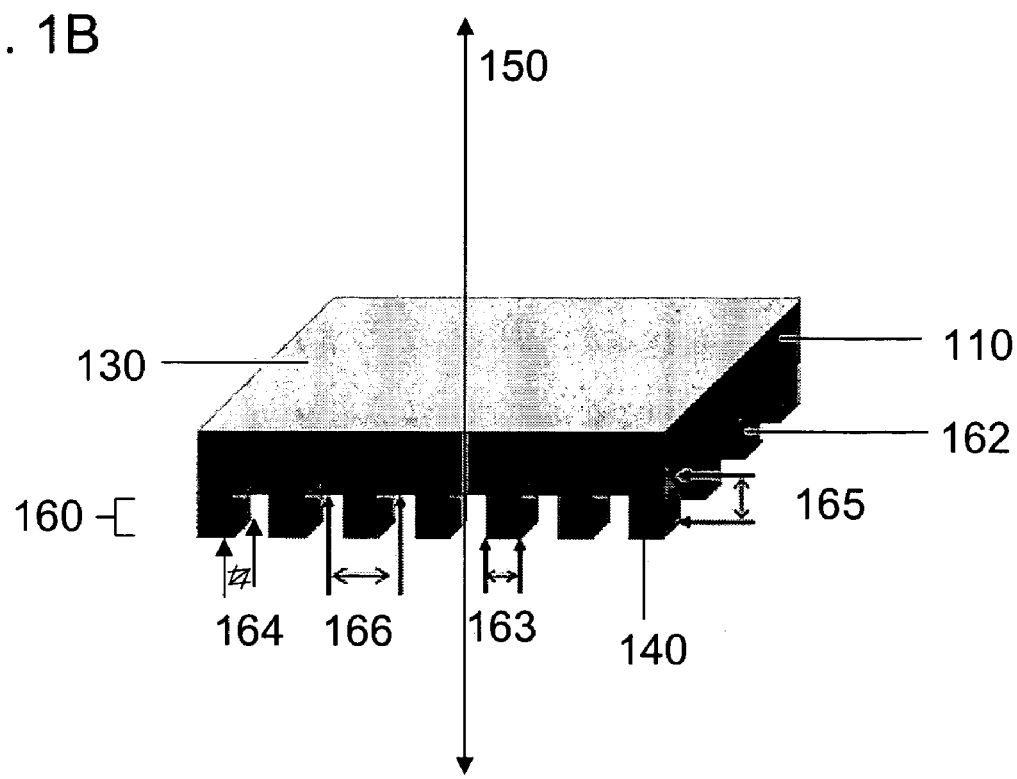
FIG. 1B shows an expanded view of a phase mask of the present invention, showing a relief pattern comprising a symmetrical pattern of relief features.

Phase mask 110 has an external surface 130 and a relief pattern 160 comprising a plurality of relief features 162. FIG. 1B shows an expanded view of phase mask 110, showing relief pattern 160 comprising a symmetrical pattern of relief features 162 having selected lengths 163, widths 164 and thicknesses 65. Relief pattern 160 is further characterized by periodicity 166, which is the spacing between adjacent relief features 162. Relief features 162 may be further characterized by their refractive indices, composition and optical pathlengths. In an embodiment useful for fabricating simple patterns of periodic nanoscale 3D structures or features and/or simple patterns of periodic nanoscale 3D structures or features having one or more controlled defect site, the lengths 163, widths 164, thicknesses 165 and/or periodicity 166 are comparable to the center wavelength of the substantially coherent beam of electromagnetic radiation 100, for example within about a factor of 2. In a useful embodiment, lengths 163, widths 164, thicknesses 165 and/or periodicity 166 are selected from the range of values of about 50 nanometers to about 5000 nanometers, more preferably for some application about 300 nanometers to about 1500 nanometers.

Referring again to FIGS. 1A and 1B, relief features 162 of relief pattern 160 also have a plurality of contact surfaces 140 disposed opposite to external surface 130, which are in conformal contact with a contact surface 170 of radiation sensitive material 120. Conformal contact between contact surfaces 140 of relief features 162 and contact surface 170 of radiation sensitive material 120 provides precise optical alignment of phase mask 110 and radiation sensitive material 120 along incident beam propagation axis 150. In some methods of the present invention useful for fabrication applications, conformal contact between contact surfaces 140 of relief features 162 and contact surface 170 of radiation sensitive material 120 is maintained throughout the entire period of exposure of the phase mask 110 and radiation sensitive material 120 to coherent beam of electromagnetic radiation 100. Phase mask 110 and radiation sensitive material 120 may also have complementary alignment grooves or channels (not shown in FIG. 1A) to provide a selected optical alignment of these device components along a plane orthogonal to incident beam propagation axis 150.

In one embodiment, substantially coherent beam of electromagnetic radiation 100 is generated directly by source of electromagnetic radiation 175, such as a narrow bandwidth source. In another embodiment, substantially coherent beam of electromagnetic radiation 100 is generated upon passage of electromagnetic radiation through a collimation element 177 and/or optical filter 178. Substantially coherent beam of electromagnetic radiation 100 is directed phase mask 110. Referring again to FIG. 1A, substantially coherent beam of electromagnetic radiation generates a spot size 180 on the external surface 130 of phase mask 110, preferably for large area patterning applications a spot size having an area equal to or greater than 0.75 mm². In methods of the present invention useful for fabricating structures wherein nanoscale features are not distributed throughout the entire thickness 125 of radiation sensitive material 120, collimation element 177 and/or optical filter 178 provide a means of selecting the extent of coherence (e.g. spatial coherence and/or temporal coherence length) of coherent beam of electromagnetic radiation 100.

Electromagnetic radiation interacts with phase mask 110 and is diffracted into a plurality of diffracted beams (schematically depicted as beams 200) which undergo optical interference where they overlap, thereby generating a optical interference pattern within radiation sensitive material 120. The distributions of intensities and polarization states of the optical interference pattern generated within radiation sensitive material depends on the lengths 163, widths 164, thicknesses 165, periodicity 166, composition and refractive index of relief features 162 of relief pattern 160. In the embodiment illustrated in FIG. 1A, diffracted beams 200 pass through the entire thickness of radiation sensitive material 120 and are transmitted by substrate 122. Use of an at least partially transmissive substrate 122 is beneficial in some fabrication applications to minimize the extent of back reflections which can adversely affect the intensity distribution of the interference pattern generated within radiation sensitive material 120.

Optionally, phase mask 110 may have amplitude varying regions (e.g. nontransmissive or partially transmissive regions) 172 which prevent transmission of portions of substantially coherent beam of electromagnetic radiation 100. Amplitude varying regions 172 comprise materials that reflect, absorb and/or scatter portions of substantially coherent beam of electromagnetic radiation 100, thereby affecting the intensity distribution of the optical interference pattern generated within radiation sensitive material 120. In one embodiment useful for some fabrication applications, amplitude varying regions 172 are thin metal films, such as gold films, having a selected reflectivity.

Interaction of electromagnetic radiation with the radiation sensitive material 120 chemically and/or physically modifies selected regions within radiation sensitive material 120, for example regions within the radiation sensitive material 120 exposed to significant intensities of the interference pattern. In one embodiment, for example, radiation sensitive material 120 is a photopolymer and undergoes chemical and/or physical modification via photoinduced polymerization reactions, such as cross linking reactions. Removal of chemically or physically modified regions of the radiation sensitive material 120, for example by chemical etching, developing processes and/or exposure to one or more solvents, generates 3D nanoscale structures having selected physical dimensions on substrate 122. In an alternative embodiment, removal of unmodified radiation sensitive material, for example by chemical etching, developing processes or exposure to one or more solvents, generates 3D nanoscale structures having selected physical dimensions on substrate 122.

As will be apparent to one of skill in the art, FIG. 1A and 1B merely provide an exemplary method of generating an optical interference pattern within a radiation sensitive material. The present invention includes methods wherein the optical interference pattern within a radiation sensitive material is generated by reflection of electromagnetic radiation by mask element 110 and methods wherein the optical interference pattern within a radiation sensitive material is generated by a combination of transmission of electromagnetic radiation through a mask element 110 and reflection of electromagnetic radiation by a mask element 110.

Figure 2:
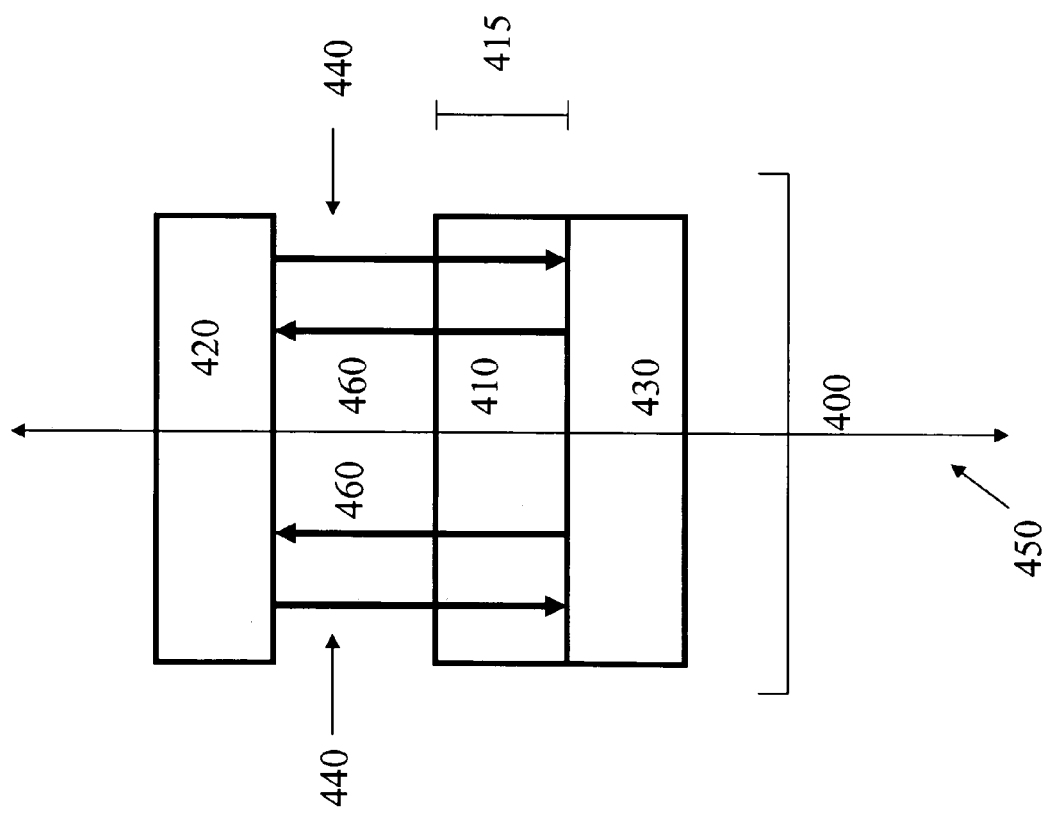
FIG. 2 is a schematic diagram illustrating an optical arrangement useful in the methods of the present invention having a radiation sensitive material positioned between a source of electromagnetic radiation and a mask element.

FIG. 2 is a schematic diagram illustrating an alternative optical geometry 400 useful in the methods of the present invention wherein a radiation sensitive material 410 is positioned between a source of electromagnetic radiation 420 and a mask element 430. Radiation sensitive material 410 and mask element 430 are positioned to intersect incident beam propagation axis 450. As shown in FIG. 2, source of electromagnetic radiation 420 generates one or more incident substantially coherent beams of electromagnetic radiation (schematically represented by arrows 440). Incident substantially coherent beams of electromagnetic radiation 440 pass through radiation sensitive material 410 having a selected thickness 415 and interact with mask element 430, thereby generating one or more reflected beams of electromagnetic radiation (schematically represented by arrows 460) which pass through radiation sensitive material 410. In this optical geometry, optical interference of incident beams 440 and reflected beams 460 generate an optical interference pattern within radiation sensitive material 420 having selected 3D distributions of intensities, amplitudes and phases.

Although the optical geometries illustrated in FIGS. 1A, 1B and 2 depicts use of one or more incident substantially coherent beams of electromagnetic radiation propagating along propagation axes parallel to an incident beam propagation axis oriented orthogonal to the surface of mask element, the present invention includes methods and devices employing non-orthogonal orientations of the substantially coherent beam of electromagnetic radiation with respect to the surface of a mask element. Specifically, the present invention may employ a substantially coherent beam of electromagnetic radiation propagating parallel to incident beam propagation axis having any orientation which intersects a mask element, such as a phase mask.

Figure 3:
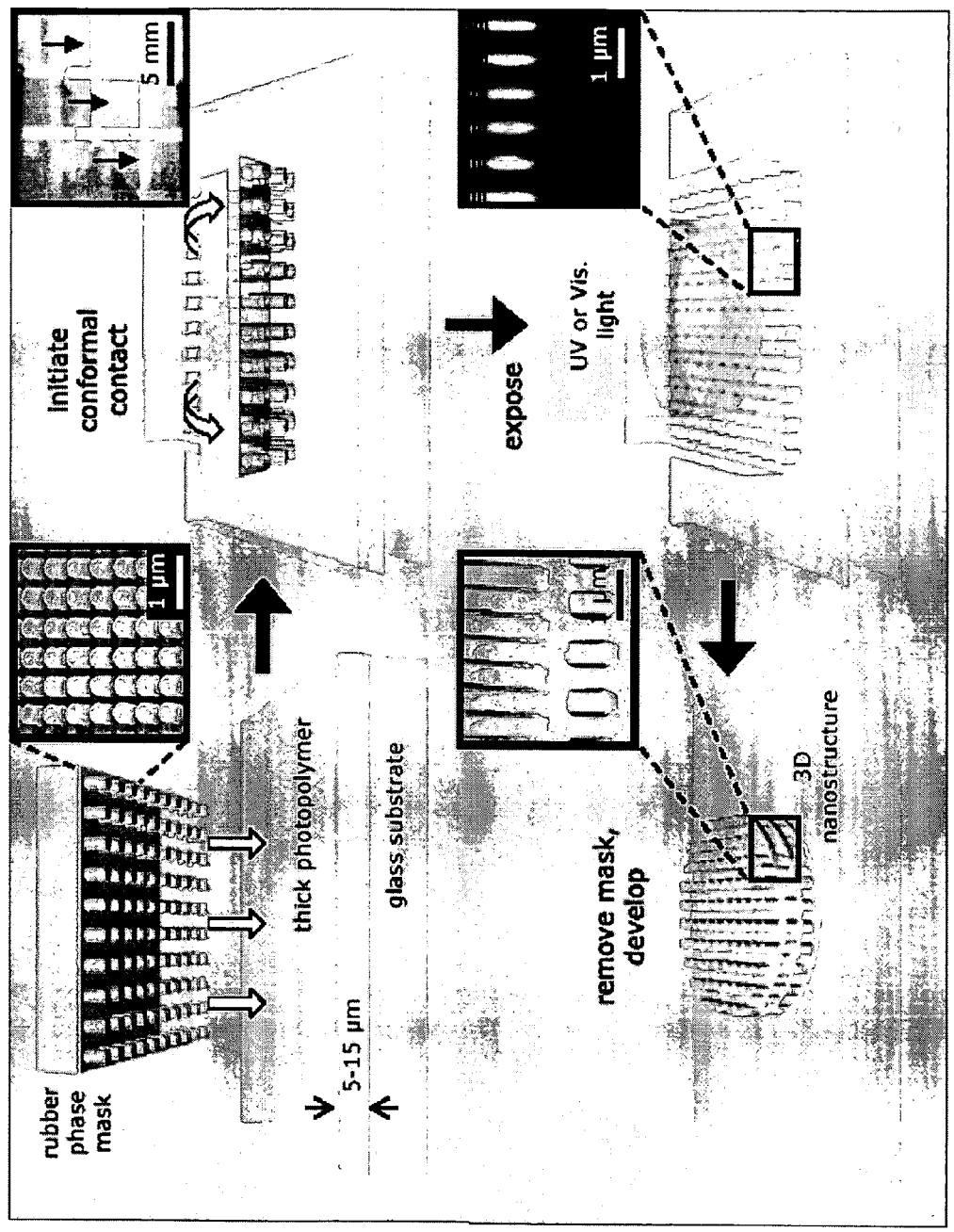
FIG. 3 provides a schematic diagram illustrating steps in an exemplary method of the present invention for fabricating nanoscale structures on a substrate surface.

FIG. 3 provides a schematic diagram illustrating steps in an exemplary method of the present invention for fabricating nanoscale structures on a substrate surface. As shown in the upper left frame of FIG. 3, a conformable, elastomeric phase mask is provided with features of relief that have dimensions comparable to the optical wavelength of electromagnetic radiation exposed to the radiation sensitive material. In this embodiment of the present invention, all the necessary optical components are built into the conformable, elastomeric phase mask. The inset in the upper left frame of FIG. 3 shows an angled view scanning electron micrograph of the surface of an exemplary phase mask formed by casting and curing a bilayer of two different types of poly(dimethylsiloxane) elastomers (Sylgard 184; Dow Corning Corp. and VDT-731, HMS-301; Gelest, Inc.) against a 'master' of photoresist patterned by 248 nm projection mode photolithography on a silicon wafer. The relief structure in the example illustrated in FIG. 3 consists of a square array of cylindrical posts having diameters of 570 nm and heights of 420 nm.

As shown in the upper right frame of FIG. 3, the conformable, elastomeric phase mask is brought into contact with, preferably conformal contact, an external surface of a solid film (5-15 microns thick, formed by spin casting) of a radiation sensitive material comprising a photopolymer (SU-8; Microchem Corp.). In an exemplary embodiment, interaction between the phase mask and the external surface of a solid film of a photopolymer the leads to intimate physical contact driven by van der Waals forces. This simple procedure aligns the phase mask to the surface of the photopolymer with atomic scale precision along axes orthogonal to in the external surface of the solid film of photopolymer. The inset in the upper right frame of FIG. 3 shows a top view optical micrograph collected as the van der Waals 'wetting' front proceeds from the top part of the image to the bottom. Complete contact over several square centimeters requires one or two seconds.

As shown in the lower right frame of FIG. 3, a beam of electromagnetic radiation is directed onto the conformable, elastomeric phase mask. Passing electromagnetic radiation through the mask generates a complex 3D distribution of intensities that exposes certain regions of the photopolymer to electromagnetic radiation. In the embodiment shown in FIG. 3, a transparent glass substrate is used to support the photopolymer film. Use of an at least partially transparent substrate, such as glass, is beneficial for some applications of the present invention because it minimizes back reflections. Use of a transparent substrate is not required in the present invention, however, and the present invention includes use of partially reflective substrates, partially absorbing substrates, highly absorbing substrates or highly reflective substrates.

The 3D distribution of the intensities generated upon passing a beam of electromagnetic radiation through the elastomeric phase mask depends on the design of the mask. Useful phase mask designs include a plurality of relief features having well defined and selected physical dimensions, relative orientations, indices of refraction and compositions. The 3D distribution of the intensities generated upon passing a beam of electromagnetic radiation through the elastomeric phase mask also depends on the wavelength distribution, polarization, temporal coherence and spatial coherence of the exposure electromagnetic radiation. Relief structures having lateral dimensions comparable to the wavelength of the exposure electromagnetic radiation and with depths sufficient to modulate the phase by a substantial fraction of $\pi$ (i.e. similar to those illustrated in the inset of the upper left frame FIG. 3) produces sub-micron, periodic 3D distributions of intensity using electromagnetic radiation that has a suitable level of coherence. The inset of the bottom right frame of FIG. 3 shows full vector simulations of this intensity distribution a representative mask geometry upon illumination with perfectly coherent electromagnetic radiation. Geometrically collimated electromagnetic radiation from the spectrally filtered output of a lamp provides sufficient coherence to form high contrast intensity distributions throughout the thickness (typically <15 microns) of many photopolymer layers. This aspect of the present invention allows structures to be fabricated using this type of low cost source of electromagnetic radiation.

Although laser sources of electromagnetic radiation may be effectively used in the present invention, they are not required in the present methods. Furthermore, the van der Waals bonding between the mask and the photopolymer minimizes relative motion of these two elements in both lateral and vertical dimensions, even for long exposure times. Therefore, external forms of vibration control or isolation are not necessary in the methods of the present invention, although they may be useful for some applications. The requirements on the optical setup are, therefore, minimal. Peeling back the phase mask completes the exposure procedure.

As illustrated in the bottom left frame of FIG. 3, the conformable, elastomeric phase mask is then removed and the photopolymer film is developed, for example using conventional developing procedures. Photogenerated acids in the exposed regions of the photopolymer initiate crosslinking reactions at elevated temperatures (75 C for 5-10 min was used). Washing away the unexposed regions of the polymer with the solvent propylene glycol monomethyl ether acetate (or with a commercial developer from Microchem Corp.) yields 3D nanostructures that have geometries defined by the intensity pattern (i.e. 3D distribution of intensities) generated by the phase mask. In an exemplary embodiment of the present methods, solvent is removed from the fabricated 3D structures by drying with supercritical $CO_2$. The inset in the bottom left frame of FIG. 3 shows a scanning electron micrograph of a typical structure generated by the methods of the present invention. Baking these structures (180 C for 5 min) after development further crosslinks the polymer and increases the physical strength of the 3D structures generated.

Supercritical drying is a useful technique for avoiding the destructive effects of surface tension during drying of fragile structures. Use of supercritical drying in some methods of the present invention improves significantly the quality of the 3D nanostructures generated by the present techniques. In these methods, the sample is developed for more than 30 minutes in developer (SU-8 developer, Microchem, Corp.) after exposure to electromagnetic radiation and transferred to a supercritical drying chamber that holds fresh developer. After cooling the chamber to −10 C, liquid $CO_2$ is added on top of the developer. The developer is then purged from the chamber under continuous supply of liquid $CO_2$. Heating drives the liquid $CO_2$ into its critical point (31.1 C, 7382 kPa). The drying is completed by removing the $CO_2$ as a gas above the critical point.

Qualitatively, the optics of the system can be understood in the following way. Passage of light through a mask that has features of binary (i.e. two levels) relief with lateral dimensions less than or comparable to the wavelength ($\lambda$) but larger than $\sim\lambda/4$ generates near the surface of the mask (i) deep intensity minima at the recessed regions and step edges and (ii) strong intensity maxima at the raised regions and near these same edges. Both effects arise from the need to maintain continuity in the electric field near abrupt shifts in phase introduced by the mask. The first can be viewed as phase induced shadowing; the second is a form of focusing from the relief features. This amplitude modulation leads to periodic variations in intensity along the z axis (axis oriented perpendicular to the substrate surface) when the light has a sufficient degree of spatial and temporal coherence.

An alternative, and consistent, conceptual view is based on the Abbe theory of image formation. It considers the intensity patterns that form when light that appears as diffraction in the far field overlaps and interferes with itself in the region near the mask. In this case, aperture filtering associated with total internal reflection of high order diffracted light in the mask produces a strong x, y and z dependent amplitude modulation of the field. Full vector solutions of Maxwell's equations obtained by finite element modeling show that near field phenomena (as defined by those effects that cannot be predicted by recombination and interference of far field diffracted light) are insignificant for most of the systems described.

Figure 4:
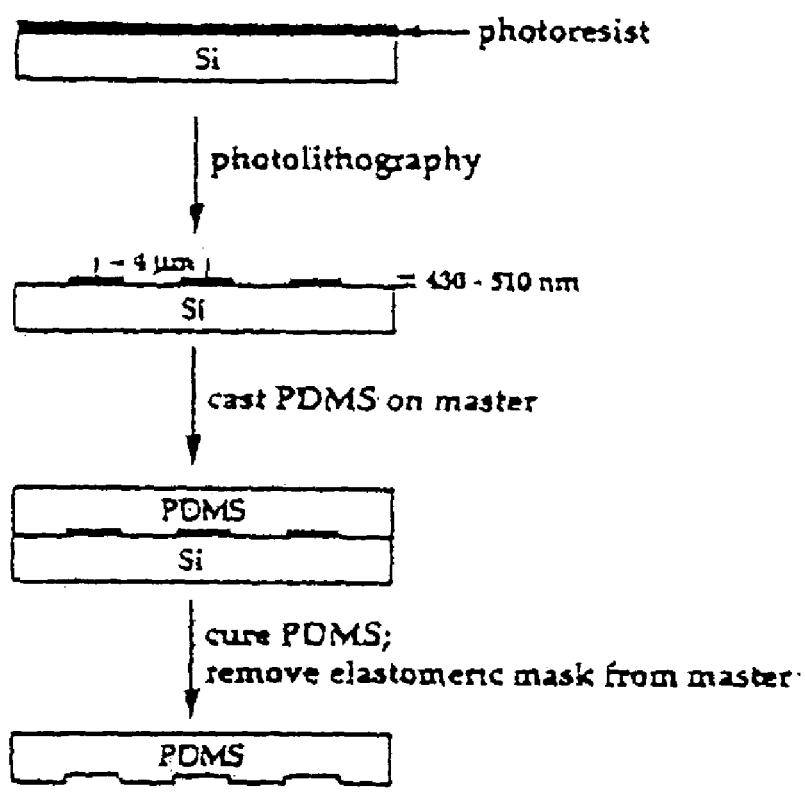
FIG. 4 is a schematic diagram illustrating an exemplary method for making an elastomeric phase mask usable in the methods of present invention.

Mask elements of the present invention, such as phase masks, may be made by any means known in the art. An exemplary elastomeric phase mask of the present invention is prepared by casting and curing polydimethylsiloxane (PDMS) prepolymer (Dow Corning Sylgard 184) against masters consisting of patterned lines of photoresist (Shipley 1805) prepared by conventional photolithography. FIG. 4 is a schematic diagram illustrating an exemplary method for making an elastomeric phase mask usable in the methods of present invention. In this method, a 3D master relief pattern is prepared from a photoresist material by conventional photolithography. As shown in FIG. 4, the elastomeric phase mask is prepared by casting a prepolymer of PDMS on the master, curing the prepolymer and removing the elastomeric phase mask from the master. The depth of relief pattern of the phase masks is varied by changing the thickness of the photoresist. The total thickness of exemplary masks are about 5 mm and the Young's modulus is on the order of 1-10 MPa.

In one embodiment, photoresist layers patterned on Si wafers by 248 nm projection mode lithography serve as 'masters' for generating phase masks of the present invention. Coating the exposed $SiO_2$ on these wafers by placing them in a perfluorinated trichlorosilane (T2492-KG, United Chemical Technologies, Inc) vapor in a small vacuum chamber prevents adhesion between the wafers and the silicone elastomers during the casting and curing procedures. A bilayer structure of two types of poly(dimethylsiloxane) (PDMS) may be used to replicate the demanding mask geometries, which have relatively tall features but small lateral dimensions. Special care may be necessary in order to form defect free surface relief structures. The casting begins by spin coating a thin film of a high modulus (10 MPa) type of poly (dimethylsiloxane) (PDMS) (VDT-731, HMS-301; Gelest Inc.) on the 'master,' for example by spin casting at 1000 rpm for 40 seconds. Allowing the wafer to continue to spin at 500 rpm for 30 minutes enables uniform wetting and partial crosslinking of the PDMS. Extremely smooth surfaces can be obtained in this manner. Pouring a prepolymer to another low modulus (2 MPa) form of PDMS (Sylgard 184, Dow Corning Corp.) on top of the first layer generates a 4-5 mm thick soft backing for easy handling of the mask. Fully curing (~75 C for 1 hour) the bilayer PDMS element and peeling it away from the 'master' yields a conformable phase mask.

Figure 5:
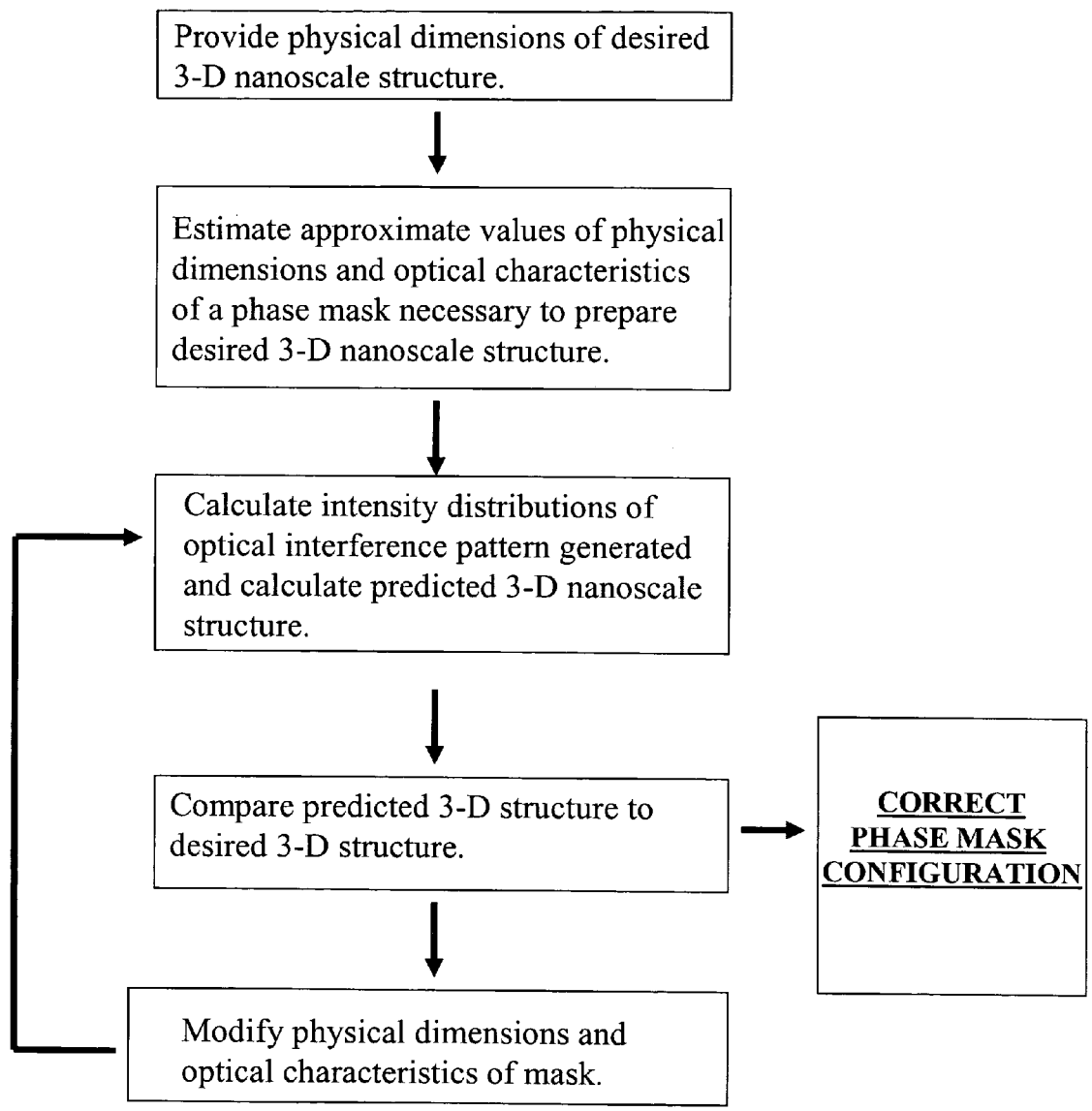
FIG. 5 is a flow diagram summarizing an exemplary method of generating a mask element having optical characteristics necessary for fabricating a 3D structure having selected lateral and vertical physical dimensions.

FIG. 5 is a flow diagram summarizing an exemplary method of generating a mask element having optical characteristics necessary for fabricating a 3D structure having selected lateral and vertical features. As shown in FIG. 5, the method comprises the steps of providing physical dimensions of a desired 3D nanoscale structure to be fabricated and estimating approximate physical dimensions and optical properties necessary to prepare a mask element capable of providing the desired 3D structure. The intensity distribution of an optical interference pattern generated by this phase mask configuration is calculated and used to generate a predicted 3D nanoscale structure corresponding to the phase mask configuration. The physical dimensions of the predicted 3D nanoscale structure is compared to the physical dimensions of the desired 3D nanoscale structure, for example by using a conventional closeness of fit algorithm. The physical dimensions and optical characteristics of the phase mask are changed appropriately. The predicted 3D nanoscale structure corresponding to the modified phase mask configuration is again generated and compared the desired 3D nanoscale structure. As shown by the arrows in FIG. 5, this process is repeated iteratively until the predicted 3D nanoscale structure agrees with the desired 3D nanoscale structure to within a selected tolerance.

The methods and devices of the present invention may be used to fabricate a variety of 3D structures, particularly nanoscale structures, useful as device components for a large number of device applications. For example, the present methods may be used to fabricate photonic crystals having feature sizes of approximately 250 nm for operation at telecommunication wavelengths of 1.5 microns. In an exemplary embodiment, these structures exist over areas of a few square centimeters per device. In high throughput fabrication applications, however, throughput and yield benefit from patterning over areas that correspond to several devices at once. In addition, the present methods may be used to fabricate nanofiltration membranes having physical dimensions ranging from about 100 nm to about 5 microns, depending on the intended use of the filter. Exemplary methods of making nanofiltration membranes involve fabrication of many square centimeter regions that may be cut up to produce individual filters. Further, the present methods may be used to fabricate passive mixers for microfluidic or nanofluidic systems having features with sizes greater than 1 micron over areas of a few hundred microns.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. Methods and devices useful for the present methods can include a large number of optional device elements and components including, fiber optic elements, birefringent elements such as quarter and half wave plates, optical filters such as FP etalons, high pass cutoff filters and low pass cutoff filters, optical amplifiers, collimation elements, collimating lens, reflectors, tubes apertures, pin holes, monochrometers, prisms, trigger pulse generators, lasers, local oscillators, diffraction gratings, focusing elements such as focusing lens and reflectors, reflectors, polarizers, fiber optic couplers and transmitters, temperature controllers, temperature sensors, optical parametric amplifier, non-linear crystals, acousto-optic modulators, broad band optical sources and narrow band optical sources.

All references cited in this application are hereby incorporated in their entireties by reference herein to the extent that they are not inconsistent with the disclosure in this application. It will be apparent to one of ordinary skill in the art that methods, devices, device elements, materials, procedures and techniques other than those specifically described herein, can be applied to the practice of the invention as broadly disclosed herein without resort to undue experimentation. All art-known functional equivalents of methods, devices, device elements, materials, procedures and techniques specifically described herein are intended to be encompassed by this invention.

EXAMPLE 1

Fabrication of a Nanoporous Filter Integrated into a Microfluidic Channel

The practical utility of 3D nanostructures depends critically on their mechanical robustness and the ability to integrate them within microsystems, nanosystems and/or larger scale components to produce functional devices. To evaluate the utility of nanostructures generated by the present methods and devices, a nanoporous filter was fabricated and integrated within a microfluidic channel in a microfluidic system. The ability of the methods and devices of the present invention to fabricate useful 3D nanostructures was verified by demonstrating good mechanical properties and filtering performance of the nanoporous filter constructed.

To illustrate these features, a 3D nanostructured filter element was fabricated comprising a plurality of 3D nanostructures and integrated into a channel of a microfluidic system for separating sub-micron particles from fluid flows. The conformable phase mask employed in this study comprises a square array of relief features with diameters of 740 nm (rounded square), relief depth of 420 nm and a duty cycle of 43%. The nanoporous filter was fabricated and integrated into the microfluidic channel using a two step exposure process. The first step was used to define the channel structure and the second step was used to pattern the 3D structures comprising the nanoporous filter by exposure through a phase mask and a 200 µm wide slit.

FIGS. 6A-L provide scanning electron micrographs and optical micrographs of a 3D nanostructure filter built into the channel of a microfluidic system using the methods of the present invention. FIG. 6A provides a 45 degrees tilted view of a Y-junction channel (channel width: 100 µm) having the integrated nanoporous filter. FIG. 6B provides a magnified scanning electron micrograph view of the nanoporous filter integrated into the microfluidic fluidic channel. As shown in FIG. 6B, the top of the 3D structure comprising the nanofilter is aligned with the top surface of the channel wall. FIG. 6C provides a magnified view of the region near the edge of the channel. FIG. 6D shows 500 nm particles (F8812, Fluo-Spheres, Molecular Probes) filtered by the 3D nanoporous filter. In FIGS. 6D, 6F and 6H the beads are shaded for ease of viewing. FIG. 6E provides a magnified view of top surface of the 3D structures comprising the nanoporous filter. In this figure, the arrow identifies an approximately 100 nm nanostructure. FIG. 6F provides a magnified view of the image shown in FIG. 6D. FIG. 6G shows an image corresponding to experimental conditions of flowing an aqueous suspension of 0.02% beads into the channel at the rate of 3 µl/min. The direction of the flow is indicated by the arrow in FIG. 6G. FIG. 6H provides a magnified image of a selected region of the image shown in FIG. 6G corresponding to the edge of the nanoporous filter. As shown in 6G, the beads remain on the left side of the filter, thus, indicating filtering of the beads.

Even the smallest parts of the 3D structures comprising the nanofilter were observed to be mechanically robust to wetting and dewetting of aqueous solutions, and to pressure driven flow. Flowing a suspension of polystyrene beads (500 nm diameter) through this filter allows the fluid, but not the beads, to pass through the nanopores. The scanning electron micrographs of parts 6D, 6F and 6H of this figure show blockage of the beads (artificially colored red in this image as an aid to the eye) by the structure. The optical image in part 6G shows cloudy fluid with suspended beads to the left of the filter and clear fluid without beads on the right. The flow is from left to right.

Swelling of the radiation sensitive material, such as the SU8 used in the present example, by the developer may induce delamination from a glass substrate. In addition, the adhesion between the glass substrate and a SU-8 layer may not be strong enough to withstand the thermal stresses that build up from differences in the coefficients of thermal expansion and the thermal cycling during the super critical drying step. To avoid these problems, we use a layer of photo sensitive material comprising a 5 µm thick film of SU-8 spin cast and flood exposed on the glass. This layer effectively improves adhesion of the patterned SU8 layer to the substrate and prevented delamination during any point in the processing. Before depositing this first uniform layer, we first treat the coverglass (Corning) substrate with $O_2$ reactive ion etching for 5 min (30 mTorr, 100W, Uniaxis 790 series). Immediately after reactive ion etching, the 5 micron thick SU-8 film is spincoated (3000 rpm, 30 seconds) and softbaked (5 minutes, 95° C.). Afterward, it is flood exposed (200 mJ/cm2) and then hardbaked at 180° C. for 5 min. The surface of this film is then exposed to the same reactive ion etching step used to prepare the glass. The SU8 layer for 3D patterning is applied by spin casting on top of this existing SU8 film. When casting and soft baking this thick (25 microns) layer, we often observed significant edge bead (i.e. thick regions near the edges of the substrate) that degraded conformal contact of the phase mask with the film. This edge bead was carefully removed with acetone to enable good contact. Another alternative method to avoid thermal cycling involved in super critical drying is transferring developed samples to a solvent when it is still wet. Solvents usable in this alternative method include ethanol, Hexa Methyl Di Silazane (HMDS) or solvents which have low surface tension energy. In this embodiment, solvent replaces developer and minimize swelling when the sample is immersed in those. Just drying samples at room temperature results in good 3D structures In some cases, however, this alternative processing steps generates structures that are slightly degraded compared to super critical drying treated samples. Structure made using this alternative method are fully applicable to microfluidic applications, including filtering and/or mixing applications.

Fabricating of the Y-junction microfluidic structure begins with exposure through an amplitude mask that has the geometry of the channels. To define the integrated 3D nanoporous filter, we contact an amplitude mask with a 200 µm wide slit to the back side of a thin (2 mm) phase mask. Bringing this composite mask against the substrate and exposing again generates a 3D patterned area in a 200 µm long region in one of the channels. After developing, the SU8 structure is treated with plasma cleaner (Harrick Scientific, Corp.) and placed against a flat piece of PDMS that was also treated with the same plasma cleaner. Heating the sample for 10 min at 70 C forms a strong bond between the PDMS and the SU8. This bonding step completes the fabrication of a sealed microfluidic system that could be loaded and pumped with fluids. The entire structure is optically transparent, which allowed for easy of viewing with an optical microscope. Degradation in the 3D structure due to filling, pumping or drying of water based suspensions is not observed.

EXAMPLE 2

Modeling calculations of the Intensity Distributions and Nanostructures Generated by Phase Masks of the Present Invention FIG. 7A-L present scanning electron micrographs and modeling results (see inserts) for a broad range of periodic structures that can be fabricated over large areas using the methods of the present invention. These methods are high versatile and may be used with a variety of phase mask types, optical configurations and light sources, such as visible and ultraviolet lasers as well as filtered mercury lamps. Rigorous coupled wave analysis defines the computed distributions of intensity in each case, as illustrated in the insets, except for frames 7H, 7I and 7J, which were determined using Fraunhofer analysis to avoid the excessive computational requirements of Rigorous coupled wave analysis for these cases. A quantitative analysis of the modeling results and scanning electron micrographs indicates good agreement between computed distributions of intensity and the shapes of 3D nanostructures generated using the present methods.

The modeling uses rigorous coupled wave analysis (RCWA) together with the concepts of Abbe theory in image formation. In particular, full vector calculations determine the intensities and phases of diffracted beams that appear in the far field after transmission through the mask. Numerically recombining these beams yields intensity distributions at any position away from the surface of the mask. This approach ignores near field effects. Separate finite element calculations of the full solutions to Maxwells equations for two dimensional masks (i.e. those with lines and spaces) show, however, that although these effects can be important in certain situations, they are negligible of all cases considered here.

Panels A-L of FIG. 7 provide scanning electron micrographs of representative 3D nanostructures fabricated using the present methods and devices. The insets in FIGS. 7A-L present the corresponding computed optical intensity distributions. In all cases except for one, the conformable phase masks used had surface relief in the geometry of a square lattice of isolated raised features with different diameters (d), relief depths (rd), duty cycles (dc), and cross sectional shapes (i.e. circle, square, etc.). The relief pattern dimensions for FIGS. 7A-7D are d=375 nm, rd=420 nm, dc=35%, and circular shapes (phase mask 1). The relief pattern dimensions for FIGS. 7E-7F are d=570 nm, rd=420 nm, dc=50%, and circular shapes (phase mask 2). The relief pattern dimensions for FIGS. 7G-7J are d=1000 nm, d=420 nm, dc=40%, and rounded square shapes (phase mask 3); The relief pattern dimensions for FIGS. 7K-7L are relief features of lines (300 nm widths) and spaces, rd=310 nm, dc=50% (phase mask 4). The photopolymer layers in all cases had thicknesses of approximately 10 microns. The tripled output (355 nm) of a Nd:YAG laser provided light for the exposures in all cases except for the structures in FIG. 7D, wherein 365 nm light from the filtered output of a mercury lamp was employed and the structures in FIG. 7F wherein 514 nm light from an Ar-ion laser was employed.

FIG. 7A shows a 3D nanostructure patterned using phase mask 1 over a large area, limited only by the size of the phase mask. FIG. 7B shows (110) cross-sectional view of the structure in shown in FIG. 7A. FIG. 7C, shows a top view of the same structure (red arrow indicates a structure approximately 100 nm in width) and the inset in FIG. 7C shows computed optical intensity distributions (the arrow in the inset of FIG. 7C indicates the direction of polarization of the exposure light). FIG. 7D shows a (100) cross-sectional view of a 3D nanostructure also formed using phase mask 1 and the filtered output of the 365 nm emission line from a conventional mercury lamp. Computed optical intensity distributions, presented in the inset of FIG. 7D and which assume perfect coherence, accounts accurately for the shape of this structure.

FIG. 7E shows a structure generated using phase mask 2 and 355 nm light. FIG. 7F shows a structure generated using phase mask 2 with 514 nm laser light and the inset of FIG. 7F presents the corresponding computed distributions of intensity. The top layer of this structure, which is present in the computed distributions of intensity, peeled off because of its thin connecting features to the underlying structure. FIG. 7G shows a structure generated using phase mask 3 and FIG. 7 H shows a close-up of tilted (100) facet of this structure. Computed distributions of intensity presented in the inset of FIG. 7H corresponds to a cross section cut through the middle of the pillars. FIG. 7I present a magnified view of the top surface of the structure shown in FIGS. 7G and 7H and the inset in FIG. 7I shows the corresponding computed distributions of intensity. FIG. 7J provides an image of the bottom surface of this structure, and the inset in FIG. 7J presents the corresponding computed distributions of intensity. FIG. 7K provides an image of a stack of sealed nanochannels fabricated using phase mask 3. In FIG. 7K, the polarization direction is parallel to lines (as shown by the arrow). FIG. 7L provides a magnified cross-sectional view of the structure in FIG. 7K, and the inset in FIG. 7L provides the corresponding computed distributions of intensity. The modeling results shown in the inset of FIG. 7L indicate good agreement with the observed geometry of this structure.

The soft lithographic casting and curing procedures that form the conformable phase masks provide considerable flexibility in the design of these optical elements and the corresponding intensity distributions generated from these elements. In addition to phase masks having periodic relief patterns used for fabrication of the structures shown in FIGS. 7A-L, phase masks having aperiodic relief patterns may also be used in the methods of the present invention. FIGS. 8A-L presents scanning electron micrographs, computed intensity distributions and confocal micrographs (Leica SP2) illustrating the geometry of an aperiodic structure made with a specially designed conformable phase mask. The results presented correspond to a mask that includes a 'defect' structure (i.e. a missing post) in a square lattice of cylindrical posts. The series of images collected with a confocal microscope reveals the full 3D shape of this polymer nanostructure. Reasonably good agreement is observed with the results of simple modeling using Fraunhofer diffraction theory. This level of understanding of the optics demonstrates a path toward the design of specialized masks for generating intensity distributions that approximate selected desired geometries.

FIG. 8A provides a scanning electron micrograph image of the surface of a 3D nanostructure formed using phase mask 1 (see above) with an isolated missing post. FIG. 8B provides a top view scanning electron micrograph image of the phase masked used to generate the structure shown in FIG. 8A. FIG. 8C shows a confocal micrograph of the x-z plane of the structure imaged at a position y that is far from the missing post (i.e. defect structure). FIG. 8D is a similar image collected at the location of the defect. The inset in FIG. 8D shows corresponding modeling results, wherein the dotted line indicates defect propagation and the corresponding region of modeled and Confocal image. FIG. 8E-L present confocal images of x-y plane and modeling at z-depths of 400 nm (FIGS. 8E and 8F), 1.5 μm (FIGS. 8G and 8H), 6 μm (FIGS. 8I and 8J), and 9 μm (FIGS. 8K and 8L).

Applying a step function cutoff filter to the computed intensity distributions provides a simple way to approximate the crosslinking and developing processes. With such a filter, it is possible to achieve quantitative agreement between the predicted and observed geometries of the polymer nanostructures. As shown in FIGS. 7A-L, patterns that range from interdigitated cylindrical structures, to arrays of complex structured hollow posts to stacks of sealed nanochannels may be produced and modeled accurately. The nonlinear response of the photopolymer can aid in generating deep sub-wavelength scale structures, but the materials aspects of the system (e.g. diffusion of the photogenerated acids, mechanical stability of the resulting structures, etc.) may in some cases limit the resolution that can be achieved. For the structures in FIGS. 7A-L, the finest features (i.e. post diameters, line widths; see red arrow) have dimensions of ~100 nm; and in certain cases features as small as 50 nm may be achieved.

The wavelength of the exposure light in the photopolymer (and to some extent the processing conditions) determines the highest spatial frequencies. For a given phase mask, films exposed with green (514 nm from an argon ion laser) light (FIG. 7f) yield patterns with less fine structure than those exposed with ultraviolet light (FIG. 7e). Patterns generated with ultraviolet laser light (355 nm tripled output from a Nd:YAG laser) differ from those generated with the geometrically collimated (by passage through a black tube with a diameter of 3 mm and a length of 17 cm) and spectrally filtered (2 nm bandwidth centered at 365 nm; ASC i-line filter, Omega Optical, Inc.) output of a conventional mercury lamp (HBO 350W Mercury Lamp, OSRAM. Lamp 87230, Oriel Instruments) in subtle ways that may be fully accounted for by the difference in wavelength. Effects of partial coherence (the temporal coherence length is ~20 μm for this case) of the filtered light from the lamp are negligible in all cases that we examined.

EXAMPLE 3

Selective Variation of Spatial and Temporal Coherence of Electromagnetic Radiation Used in the Present Methods In embodiments of the present invention useful for a number of fabrication applications, the spatial coherence and/or temporal coherence of the electromagnetic radiation used in the present methods is selectively adjusted to control important structural characteristics of 3D structures fabricated, such as the region of a 3D structure in which nanoscale and/or microscale features are localized. Control provided by selective variation of spatial and/or temporal coherence is used in these methods of the present invention to optimize selected structural characteristics for a diverse range of applications, device configurations and device environments.

In one embodiment, the temporal coherence and/or spatial coherence of electromagnetic radiation directed onto a mask element in optical communication with a radiation sensitive material is selected to prepare 3D structures comprising a plurality of nanoscale or microscale features localized in a discrete region of the structure formed, for example a region of the structure corresponding to the portion of the radiation sensitive material located proximate to the mask element. This embodiment of the present invention is capable of generating a 3D structure having a discrete region comprising nanoscale and/or microscale features which does not extend all the way through the fabricated structure. Accordingly, this aspect of the present invention is useful for preparing 3D structures comprising a first portion having a plurality of nanoscale and/or microscale features and a second portion comprising a region substantially free of such features.

Figure 9A:
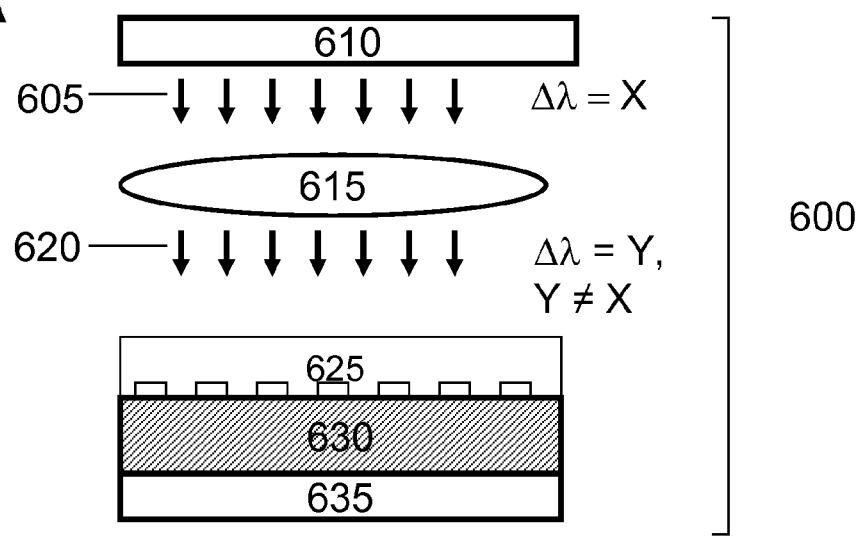
FIG. 9A shows an exemplary optical configuration for controlling the temporal coherence of electromagnetic radiation in methods of fabricating structures of the present invention.

Selective variation of the temporal coherence of electromagnetic radiation used in this aspect of the present invention is provided by selection of the appropriate bandwidth of the incident beam of electromagnetic radiation directed onto the mask element. In one embodiment, bandwidth of electromagnetic radiation incident to the mask element is selected using of optical filters, such as a Fabry-Perot optical interference filter or combination of high pass and low pass cut-off filters, dispersive elements, such as prisms, grating and monochrometers, or any combination of these. FIG. 9A shows an exemplary optical configuration 600 for controlling the temporal coherence of electromagnetic radiation in methods of fabricating structures of the present invention. As shown in FIG. 9A, electromagnetic radiation 605 having a first temporal coherence is generated by source of electromagnetic radiation 610 and passed through an optical filter 615, such as an optical interference filter (e.g. Fabry-Perot filter). Passage of electromagnetic radiation through the optical filter 615 changes the bandwidth ($\Delta\lambda$) of the beam of electromagnetic radiation, thereby generating electromagnetic radiation 620 having a selected temporal coherence, which is directed onto phase mask 625 in conformal contact with radiation sensitive material 630 on substrate 635. Variation of the bandwidth of incident electromagnetic radiation is used in the present methods to selectively vary or "tune" the temporal coherence, for example by rotation of an optical interference filter about an axis orthogonal to the propagation axis of the beam or by selectively adjusting the physical dimensions, such as diameter, of entrance and/or exit apertures in a monochrometer.

Figure 9B:
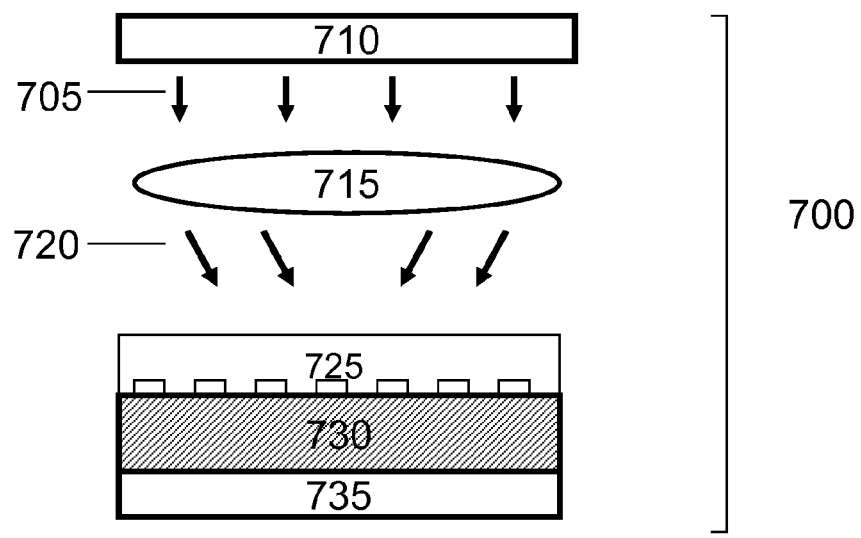
FIGS. 9B and 9C show exemplary optical configurations for controlling the spatial coherence of electromagnetic radiation in methods of fabricating structures of the present invention.
Figure 9C:
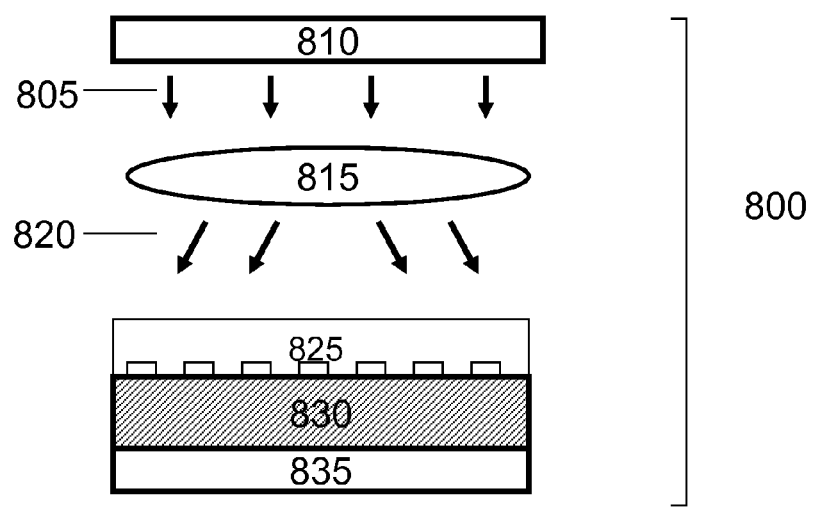

Selective variation of the spatial coherence of electromagnetic radiation used in this aspect of the present invention can be provided by selective adjustment of the range of incident angles of the incident beam of electromagnetic radiation via collimation optics, such as lens, collimation tube, slit and/or pinhole, positioned between the source of electromagnetic radiation and the mask element. Variation of the physical dimensions of apertures or the position of lens elements relative to the mask element in this embodiment can be used in the present invention to selectively vary or "tune" the spatial coherence. FIGS. 9B and 9C show exemplary optical configurations for controlling the spatial coherence of electromagnetic radiation in methods of fabricating structures of the present invention. As shown in the optical configuration 700 illustrated in FIG. 9B, electromagnetic radiation 705 having a first spatial coherence is generated by source of electromagnetic radiation 710 and passed through a lens element 715, which focuses the beam of electromagnetic radiation. Focusing provided by element 715 generates electromagnetic radiation 720 having a selected temporal coherence. As a result electromagnetic radiation is slightly focused when it passes through phase mask 725 in conformal contact with a radiation sensitive mater 730 on substrate 735. As shown in the optical configuration 800 illustrated in FIG. 9C, electromagnetic radiation 805 having a first spatial coherence is generated by source of electromagnetic radiation 810 and passed through a lens element 815, which increases the divergence the beam of electromagnetic radiation. Selective adjustment of the beam divergence provided by element 815 generates electromagnetic radiation 820 having a selected temporal coherence. As a result electromagnetic radiation is slightly divergent when it passes through phase mask which is directed onto a phase mask 825 in conformal contact with a radiation sensitive mater 830 on substrate 835.

In one embodiment of this aspect of the present invention, the temporal coherence, spatial coherence or both of the incident beam of electromagnetic radiation is selected to generate a 3D structure having nanoscale and/or microscale features that do not extent entirely through thickness of the radiation sensitive material. Selection of temporal coherence, spatial coherence or both in this embodiment can be used to select the physical dimensions of the region of the structure wherein nanoscale and/or microscale structures are localized. For example, the present invention can be used to generate a 3D structures having features localized to the top half, third or quarter of the structure and, wherein the structure also comprises a region substantially free of such features. In some embodiments of this aspect of the present invention, a region having localized features has a thickness selected over the range of about 0.5 microns to about 50 microns. This embodiment of the present invention is particularly useful for preparing 3D structures that can be easily incorporated into a device or device component, such as a microfluidic device, microelectromechanical device, nanoelectromechanical device or photonic system. For example, structures fabricated by these methods can be easily manipulated without damaging the nanoscale and/or microscale features by contacting the region substantially free of features. In addition, an exposed surface of the region substantially free of features can be effectively used as a bonding surface for integrating the structure into a device or device component.

In another embodiment of this aspect of the present invention, the temporal coherence, spatial coherence or both of the incident beam of electromagnetic radiation is selected to generate a 3D structure having a gradual, continuous transition from nanoscale and/or microscale features in a first region of the fabricated structure to a second region of the fabricated structure substantially free of features. In this context, the expression "continuous transition" refers to a change in the density of features from a high density region to a region substantially free of such features or having a low density of features. An advantage of a structure having a such a continuous transition from a first region having a high density of features to a second region having a lower density of features or substantially free of features is that it exhibits improved mechanical robustness and, thus, the features are less likely to break or degrade under strain. In addition, structures having such a continuous transition from first and second regions may exhibit enhanced functional properties. Selection or tuning of the spatial and/or temporal coherence also provides a means of selecting the feature density gradient (or slope) in the continuous transition region, therefore, allowing fabrication of structures characterized by a small feature density gradient wherein the density of nanoscale features or structures changes slightly as a function of the thickness of the radiation sensitive material and structures characterized by a large gradient wherein the density of nanoscale features or structures changes rapidly as a function of the thickness of the radiation sensitive material.

Figure 10B:
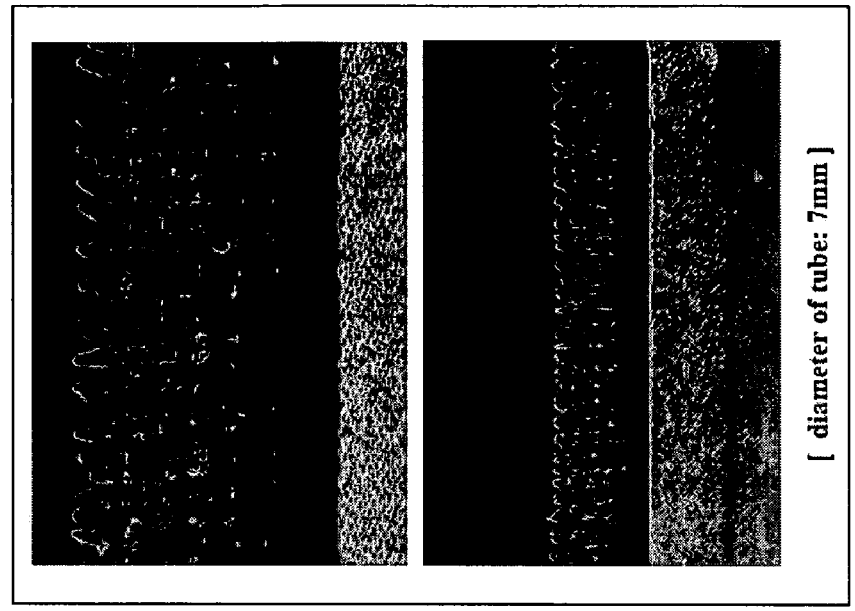
FIGS. 10A-C provide scanning electron micrographs of 3D structures showing the effect of selective adjustment of spatial coherence on the thickness of a layer containing features in structures generated by the present methods.
Figure 10A:
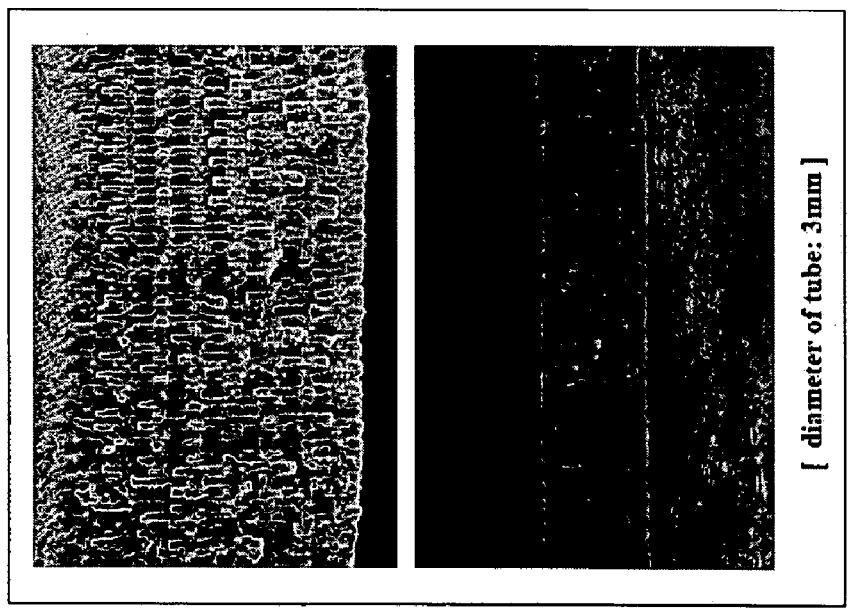
Figure 10C:
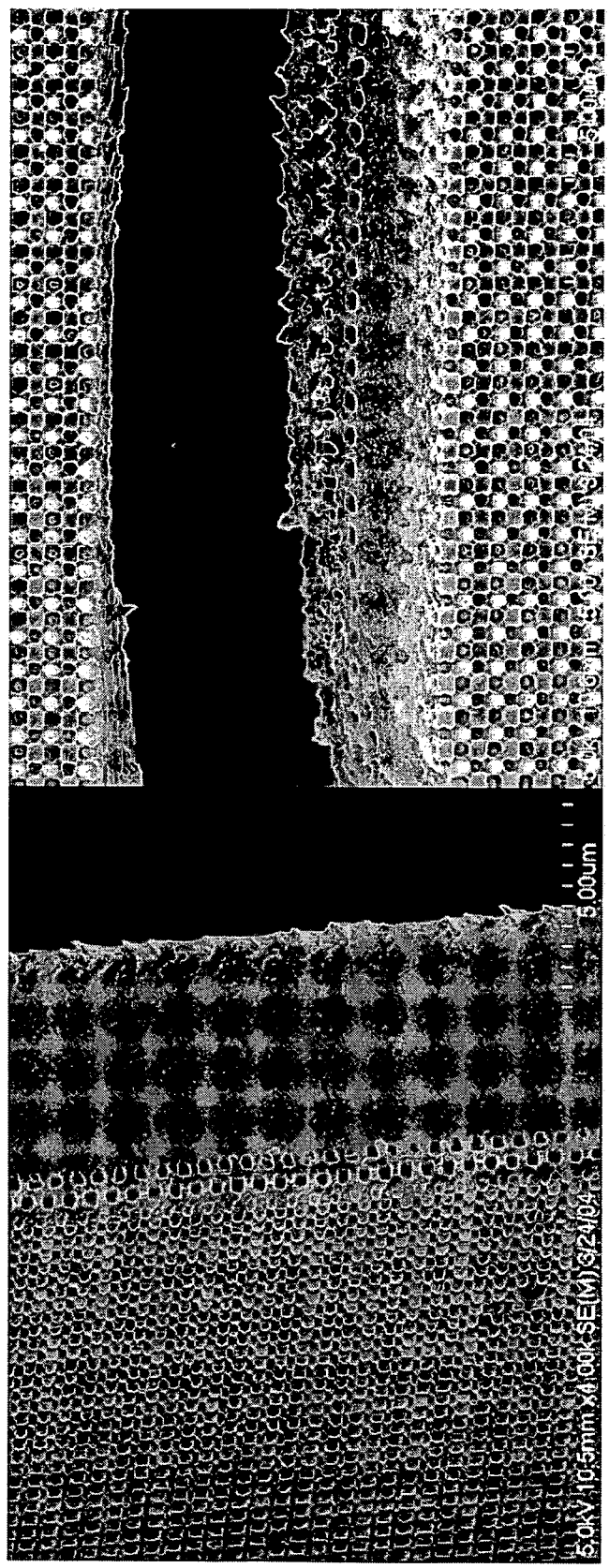

FIGS. 10A and 10B provide scanning electron micrographs of 3D structures showing the effect of selective adjustment of spatial coherence on the thickness of a layer containing features in structures generated by the present methods. The structures were generated using a broad band light source, optical filter having a full width at half maximum equal to 2 nanometers and a radiation sensitive material comprising a layer having a thickness of about 10 microns. Two aperture diameters were used in this example to select the spatial coherence of the incident beam of electromagnetic radiation. A 3 millimeter diameter was used for the structure shown in FIG. 10A and a 7 millimeter diameter was used for the structure shown in FIG. 10B. As shown in FIG. 10A, use of a 3 millimeter diameter aperture resulted in formation of a structure characterized by features extending entirely throughout the 10 micron layer. In contrast, as shown in FIG. 10B, use of a 7 millimeter diameter aperture resulted in formation of a structure characterized two regions: a first region having a high density of features and a second region substantially free of features. Selection of the spatial coherence of the beam of electromagnetic radiation used for fabricating the 3D structure shown in FIG. 10B provided control of the thickness of the first feature-containing region. As also shown in FIG. 10B, the density of features in this structure was observed to vary continuously from a high density zone at the surface of the structure to a second region substantially free of features. FIG. 10C shows electron micrographs of other structures fabricated by the present methods having localized nanoscale features that do not extend through the full depth of the radiation sensitive material.

As described above, controlling the properties of the exposure electromagnetic radiation, such as coherence length, provides a sensitive means of adjusting the geometries of structures made by the methods of the present invention. For example, when a coherence length is selected that is substantially longer than the thickness of the radiation sensitive material (e.g. photopolymer) undergoing processing, good contrast is obtained in the distribution of intensity throughout the thickness of the radiation sensitive material. One the other hand, when a coherence length is selected that is less than the thickness of the radiation sensitive material, only the upper regions (i.e. regions proximate to the phase mask in conformal contact) of the film are structured into 3D geometries. In these methods, the lower parts of the film are uniformly cured. This solid underlayer serves as a support for the 3D structure above it and as a layer for strong adhesion to the underlying substrate. This capability is important in some applications for achieving devices that are robust mechanically. The coherence length of light from a lamp is easily controlled using filters to adjust the range of wavelengths (temporal coherence) and/or by using simple collimation optics (i.e. hollow tubes, apertures or lens) to control the spread of incident angles (spatial coherence). This aspect of the present invention provides enhanced flexibility with respect to the type of structures that can be fabricated by the present methods.

EXAMPLE 4

Fabrication of a Passive Fluid Mixing Device for Microfluidic Applications

To evaluate the utility of nanostructures generated by the present methods and devices, a nanostructured passive mixing device was fabricated and integrated within microfluidic channels of a microfluidic system. The ability of the methods and devices of the present invention to fabricate useful 3D nanostructures was verified by demonstrating good mechanical properties and fluid mixing performance of the nanostructured passive mixing device constructed.

To illustrate these features of the present invention, a 3D nanostructured passive fluid mixing element was fabricated comprising a plurality of 3D nanostructures, and integrated into a plurality of channels of a microfluidic system for combining and mixing two fluid flows. Passage of two discrete fluids through the nanostructured passive fluid mixing element was shown to induced effective fluid mixing. Use of a nanostructured passive fluid mixing element comprising 3D nanostructures for fluid mixing applications is particularly useful due to the long effective fluid path lengths provided by these structures.

Figure 11:
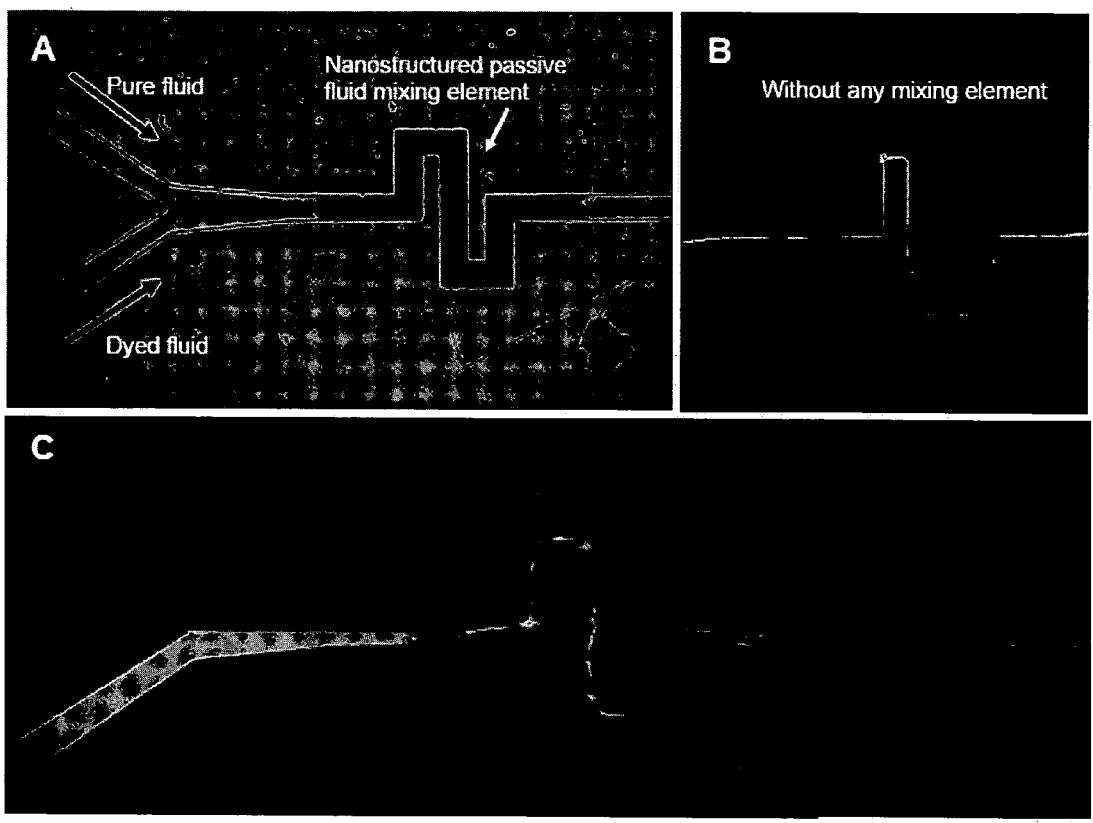
FIG. 11 provides an optical micrograph of a nanostructured passive fluid mixing element fabricated by the methods of the present invention and integrated into a microfluidic system.

FIG. 11 provides an optical micrograph of the nanostructured passive fluid mixing element fabricated by the methods of the present invention and integrated into a microfluidic system. As shown in FIG. 11 a pure fluid flow is provided in a first microfluidic channel (top channel) and a dyed fluid flow is provided in a second microfluidic channel (bottom channel). Pure and dyed fluid flows are each separately introduced into the nanostructured passive fluid mixing element. Both fluid flows undergo mixing, thereby generating a fully mixed fluid component that exits the nanostructured passive fluid mixing element and passes through a third microfluidic channel (channel to the right). FIG. 11B shows the extent of mixing without the passive fluid mixing element present. FIGS. 11C shows the extent of mixing with the passive fluid mixing element present. A comparison of FIGS. 11B and 11C indicate that the nanostructured passive fluid mixing element of the present invention provides a high degree of fluid mixing, as shown by the substantially more spatially variable distribution of dyed fluid in the mixing element. Further, the nanostructured passive fluid mixing element of the present invention undergoes little or no structural degradation for a range of useful fluid flow rates and operating times.

EXAMPLE 5

Fabrication of Photonic and Phononic Bandgap Materials

Photonic and phononic bandgap materials continue to draw the attention of the research community due to the possibility of achieving control over the properties of photons at a level similar to that of electronics in semiconductors. One of the greatest challenges in the field of photonic bandgap materials and devices is the lack of a high throughput, large area, low cost fabrication techniques that can build the classes of 3D nanostructures that are required for these systems. The highly engineered methods developed by the semiconductor industry are not well suited for fabricating these materials because their patterning capabilities are inherently two dimensional (2D) (i.e. they pattern thin layers of material on ultraflat surfaces). Fabricating 3D structures requires the sequential application of many 2D patterning steps, which is cumbersome and slow. Furthermore, this strategy can be difficult to apply for more than a few patterned layers, even with the most sophisticated and expensive facilities. As a result of these limitations, high throughput, large area fabrication methods are currently needed for fabrication of photonic and phononic bandgap materials.

The methods of the present invention satisfy this long felt need in the art as they are well suited for low cost, high throughput fabrication of 3D structures comprising a wide range of photonic and phononic bandgap materials and devices. Particularly, sensitive control of the physical dimensions of 3D structures fabricated by the present methods provides the capability to generate photonic and phononic structures having a useful range of optical properties. Application of the methods of the present invention for fabrication of these materials and devices utilize a conformable phase mask having sub-wavelength features of relief embossed onto its surface positioned in conformal contact with a radiation sensitive material. An advantage of the present techniques is that all of the optics are built into this single optical element thereby allowing precise optical alignment via establishing van der Waals interactions between the conformable phase mask and a layer of radiation sensitive material to be patterned. The resulting conformal contact between these elements provides an experimental setup that is highly tolerant of vibrations. Furthermore, the experimental setup does not require any special procedures for optical alignment, low coherence exposure source can be used for processing and the resolution can be exceedingly high due to the contact mode operation. Another advantage of the present techniques is that the flexibility in the design of the conformable phase masks allows defect structures and aperiodic (i.e. chirped) features to be integrated easily.

Application of the present methods to fabrication of photonic and phononic materials requires phase mask designs that yield structures with large bandgaps. It is well known that diamond lattice structures form such gaps, provided that there is sufficiently high variation in index of refraction. Structures with tetragonal symmetry and layered square symmetry can also have good bandgap properties. A phase mask that has a square array of posts (or holes) with appropriate height (to shift the phase of the transmitted light by $\pi$) and fill factor (~50%) will generate 4 coplanar diffraction orders simultaneously with divergence angles determined by the periodicity. A 5 beam configuration that includes the zeroth order can generate intensity distributions with body centered tetragonal structure. Use of a phase mask having this simple symmetry, where the ratio of c/a lattice parameters is close to 1.2, yields structures with full photonic bandgaps (PBG).

Structures comprising hexagonal arrays of posts, which can produce lattices with cubic or hexagonal symmetry, are also useful a photonic and phononic materials that can be fabricated using the present methods. A 7 beam configuration generated with such a mask will yield a structure that consists of two fcc lattices superposed on top of one another with a rigid rotation between them. A diamond structure can be interpreted as two superposed fcc lattices with a rigid translation. Both structures consist of a periodic array of tetragon shaped building blocks. The highly periodic nature of an array of this type of unit cell can result in large bandgaps, whether they are in the diamond layout or in the layout produced by 7 beam interference.

Figure 12A:
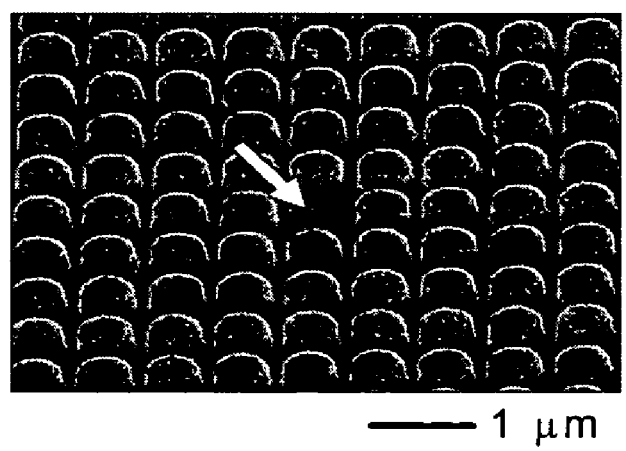
FIG. 12A shows a scanning electron micrograph of a phase mask having an isolated defect comprising a missing post.
Figure 12B:
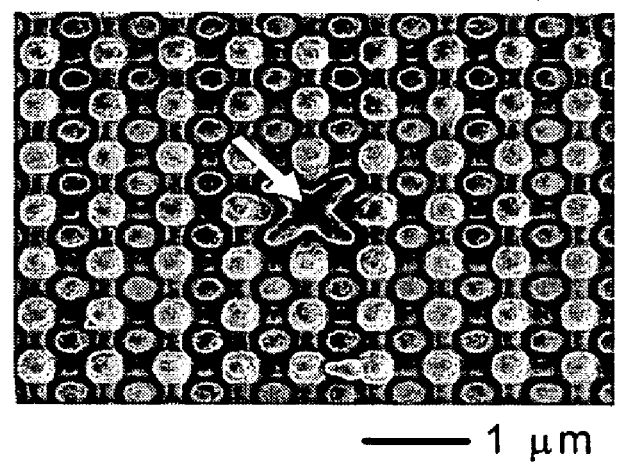
FIG. 12B shows the resulting 3D structure generated using this phase mask.

In addition to regular, fully periodic bandgap structures, the present methods can also produce aperiodic structures, such as well defined point or line defects, continuously varying periodicities (i.e. chirps), in addition to many other possibilities. FIG. 12A shows, as an example, a scanning electron micrograph of phase mask having an isolated defect comprising a missing post, and FIG. 12B shows the resulting 3D structure generated using this phase mask. The ability to chirp these types of masks, either by appropriate design of the 'master' or by spatially varying mechanical compression of the mask itself, makes it possible to build bandgap structures with broadband operation. It is also possible to add amplitude modulating components to the mask, and to control the depth of phase modulation.

A final consideration is the mechanical stability of the elastomeric masks and their ability to form structures with good long range spatial coherence. Past work shows that variations in the period of distributed feedback laser gratings fabricated by using such masks as molds is on the order of 0.1% over several square centimeters. This level of distortion is sufficient for many applications of the present invention. The present invention includes embodiments, however, that use phase masks comprising composite elements having thin layers of PDMS cast against glass or high modulus polymer backings. Phase masks comprising such composite elements exhibit lower distortions upon establishing conformal contact than those using PDMS alone.

Exemplary phase masks useful for making photonic and phononic materials are made of the elastomer poly(dimethylsiloxane) (PDMS; Sylgard 184, Dow Corning) and are fabricated simply, and at low cost using soft lithography casting and curing procedures. Structure serving as 'masters' in these processes are fabricated by patterning photoresist on a silicon wafer using projection mode photolithography. Upon contact with a radiation sensitive materials, such as thin solid film of a photopolymer, surface forces, such as those arising from van der Waals type interactions, drive the mask into atomic scale contact with the surface of the polymer, without externally applied force. This passive process yields optical alignment with nanometer precision in the vertical direction. Light passing through the mask generates a 3D distribution of intensity that exposes the photopolymer film throughout its thickness. Conceptually, this intensity distribution can be conceptualized of as being generated by the spatial overlap near the mask surface of beams produced by diffraction. Removing the mask and developing away the parts of the polymer that are not crosslinked by the exposure light yield a 3D nanostructure in the geometry of the intensity distribution, with feature sizes as small as 50 nm. Because exposure of the polymer occurs in proximity to the surface of the mask, we will refer to this technique as a Proximity field nanopatterning method. For the following results, a thin (~10 μm thickness) solid films of a photopolymer (SU-8, Microchem Corp.) were used.

Developing the sample requires special care to avoid damage of the structure by capillary forces associated with drying and maximize the mechanical robustness of the resulting structures. Therefore, use of low surface energy fluids is preferred for some embodiments. In addition, super critical drying (SCD) yields the high quality structures in the present methods. In an exemplary embodiment, wet samples are transferred from developer to pure ethanol and then dried them at room temperature.

The geometry of phase mask defines the resulting 3D structures. Important design factors include the 2D lattice constants, duty cycle (i.e. feature size) (dc), relief depth (rd), and shape and size of the relief features. Four different phase masks were used to produce structures reported in this example.

Mask 1: circular dot (d=375 nm), dc=35%, rd=420 nm
Mask 2: circular dot (d=570 nm), dc=50%, rd=420 nm
Mask 3: circular dot (d=410 nm), dc=26%, rd=520 nm FIGS. 13A-D provides scanning electron micrographs of structures fabricated using the present methods. FIG. 13A shows a structure fabricated using Mask 1 exposed to electromagnetic radiation having a wavelength of 355 nm. FIG. 13B shows a structure fabricated using Mask 2 exposed to electromagnetic radiation having a wavelength of 514 nm. FIGS. 13C and 13D show a structure fabricated using Mask 3 exposed to electromagnetic radiation having a wavelength of 810 nm.

The present fabrication methods are applicable to photo-initiation of chemical reactions in a radiation sensitive material, such as cross linking polymerization reactions, by single photon absorption processes and multiple photo absorption processes. Both single photon and multiple photon initiated polymerization reactions are used in the present example to fabricate 3D structures comprising nanoscale features. In fabrication methods using multiphoton absorption, a 130 femtosecond (fs) pulses at 810 nm from a regeneratively amplified Ti:sapphire laser with 1 kHz repetition rate is used to satisfy the two photon threshold of a SU-8 photopolymer used in these experiments. The energy of each pulse is about 250 μJ, which make the peak pulse power close to 2 GW when a round spot size with diameter of ~500 μm is used. The typical exposure time was in the range of 30 to 240 seconds. The beam was circularly polarized with a quarter wave plate and spatially filtered with a diamond pinhole. Use of mutliphoton initiated photochemistry provides an enhancement in the resolution of the features generated due to the narrower spatial distribution of photon intensities great enough to drive multiphoton absorption processes in the photopolymer.

The present fabrication methods were numerical evaluated by molding studies using rigorous coupled wave analysis (RCWA) together with the concepts of Abbe theory in image formation. In particular, full vector calculations with a commercial software package (Gsolver, Grating Solver Development Company) are used to determine the intensities and phases of diffracted beams that appear in the far field after transmission through the phase mask. Numerically recombining these beams yields intensity distributions at any position away from the surface of the mask. More than 4 noncoplanar beams involved in the present invention require full consideration of polarization and phase of each beam. This modeling method is an important tool to analyze 3D structures capable of fabrication via the present proximity field nanoPatterning methods. However, the present modeling approach ignores near field effects. Separate finite element calculations of the full solutions to Maxwells equations for two dimensional masks (i.e. those with lines and spaces) show, however, that although these effects can be important in certain situations, they are negligible of all cases considered in the present example.

The phase mask creates a modulation in the electric field with periodic minima and maxima along z. The self image formation of the grating (i.e. the Talbot effect) along the z-depth is responsible for this effect. The Talbot distance is a function of grating periodicity and incidence wavelength. This equation can be derived from the point of Abbe theory of image formation because the orders involved in image formation has diffraction angle that depends on wavelength and mask periodicity. The fractional Talbot distance can be understood by the interaction between coplanar diffracted orders. In case of a mask with a square array of dots, the simplest 3D periodic structure (i.e. body centered tetragonal) can be expected from 5 beam interference when the divergence angle is large enough that orders other than the $0^{th}$ and $1^{st}$ can be neglected.

Only the spot size of the light source and the size of the phase mask limit the size of the patterned areas. 3D nanostructured films with thicknesses up to 100 μm can be achieved; only the structural integrity and optical absorption of the photopolymer limit this thickness. This new method holds exceptional promise as a general platform technology for large area, rapid, low cost 3D nanopatterning—a capacity that other known techniques currently lack.

Figure 14A:
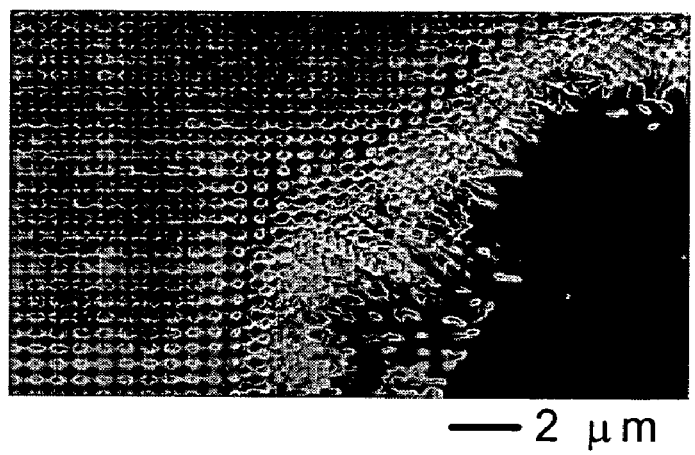
FIGS. 14A and 14B provides scanning electron micrographs of structures generated multiphoton processing methods of the present invention.
Figure 14B:
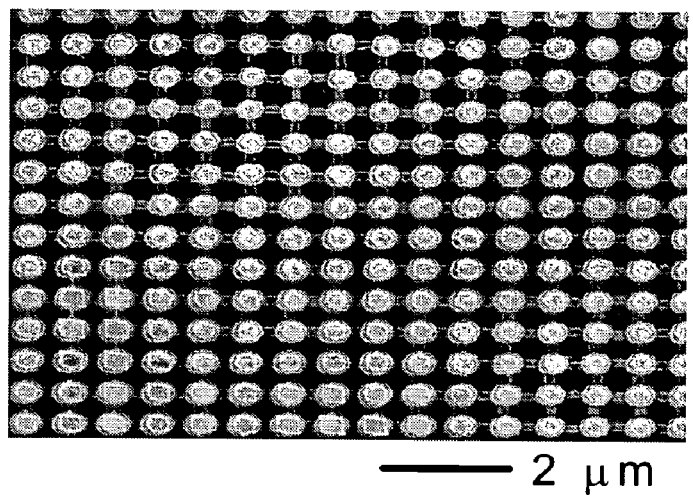

The present methods have the capability to generate structures by multiphoton interactions of the exposure light with the photosensitive material. For example, commercially available photopolymers based on SU-8 photopolymer which are normally (i.e. in the linear regime) only sensitive in the ultraviolet (UV) region, can be crosslinked by two photon effects for sufficiently intense exposure light with a wavelength around 800 nm. FIGS. 14A and 14B provides scanning electron micrographs of structures generated multiphoton processing methods of the present invention. These structures were generated using an amplified femtosecond laser as the source of electromagnetic radiation exposed to the SU-8 photopolymer. The capability of the present invention to fabricate structures via chemical reactions initiated by multiphoton absorption processes is important because: (1) it expands the range of materials that can be used with the present invention, since it relaxes the requirement for transparency in the ultraviolet; and (2) it allows additional lattice parameters to be achieved. For example, this capable allows use of radiation sensitive materials that do not significantly transmit ultraviolet electromagnetic radiation but are transparent in the visible region of the electromagnetic spectrum. It is also important to note that multiphoton patterning with the present method is remarkably simple and requires no change in the experimental arrangement. It is virtually impossible to do similar exposures by conventional interference lithography because it requires matching of path lengths of multiple beams to within tens of microns.

Figure 15A:
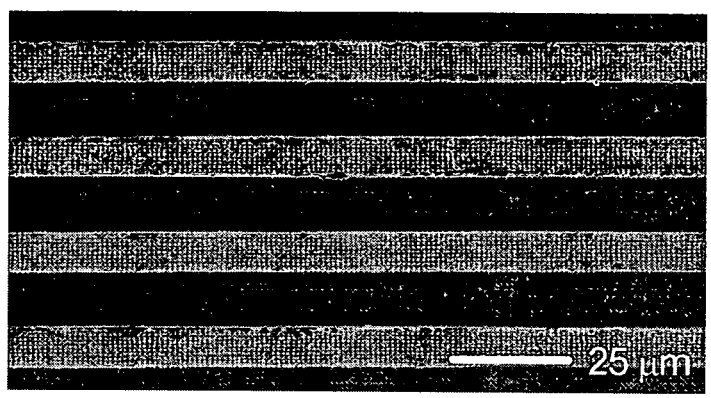
FIGS. 15A and 15B provides a scanning electron micrograph of a structure generated using a phase mask to mold relief directly into the surface of the photopolymer, in addition to providing photoprocessing via the present nanofabrication methods.
Figure 15B:
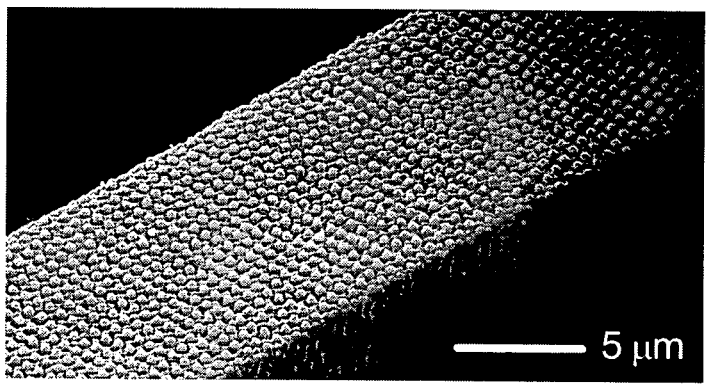

Combining the present Proximity field nanoPatterning technique with other conventional and unconventional approaches allows 3D nanostructures to be integrated into micron and millimeter scale elements such as couplers, waveguides and other devices. FIGS. 15 A and 15 B provide, as an example, scanning electron micrographs of structures generated using a phase mask to mold relief directly into the surface of the photopolymer, in addition to providing photoprocessing via the present nanofabrication methods. The relief in this case consisted of a square array of sub-micron posts on top of micron wide and deep ridges. Flood exposing such an embossed structure generates structures in which the photopolymer itself provides optical modulation for generating the 3D nanostructures and the final molded structures that support those structures. With this approach, it will be straightforward to integrate 3D bandgap structures into waveguides and other coupling and tuning devices required for functional systems.

The present invention also includes maskless lithographic fabrication methods. In these methods, a relief patterning element (such as conformable phase mask of the present invention or indentation tool) is used to emboss a selected relief pattern directly onto an exposed surface of a radiation sensitive material undergoing processing. In one embodiment, for example, a relief patterning element, such as a phase mask having a selected relief pattern, is brought into contact with a radiation sensitive material present in a physically deformable state. Contact between the two elements embosses or molds a selected relief pattern onto the surface of the radiation sensitive material. Subsequently withdrawal of the patterning element, exposure of the radiation sensitive to electromagnetic radiation and developing generates one or more regions having a selected pattern of nanoscale features positioned below the embossed structure. In these methods, the embossed relief pattern itself functions as the mask element for generating the appropriate optical interference pattern having a selected distribution of intensities and polarization states with in the bulk of the radiation sensitive material. An advantage of this method of the present invention is that the extra step of removing the phase mask after exposure is avoided, which may be advantageous in avoiding mechanically strains introduced upon separation of the phase mask from the radiation sensitive material. In addition, structures made by maskless lithographic fabrication methods of the present invention are important for narrow band optical filters or superslim holographic correlators. Furthermore, these methods are useful for fabrication of three dimensional structures on curved surfaces because of the bendable nature of a relief patterning element, such as a conformable phase mask, helps micro or nano indentation at these surfaces. Also, maskless lithographic fabrication methods of the present invention are effective methods when the wetting of phase mask is poor and/or when it is hard to achieve full contact between a phase mask and a radiation sensitive material.

Use of a phase mask in optical communication with a radiation sensitive material having a molded—or embossed relief pattern also provides useful methods of the present invention for building a variety of structures. In these embodiments, the combined optical properties of the phase mask and the molded or embossed region of the radiation sensitive material determines the distribution of intensities and phase comprising the optical interference pattern generated within the radiation sensitive material. FIGS. 16A-C illustrate structures and steps in a method of the present invention wherein a phase mask having a selected relief pattern is positioned in conformal contact with an embossed relief pattern of a radiation sensitive material. As shown in FIG. 15A micromolding is used to fabricate an embossed relief pattern comprising an indentation of dots (top panel of FIG. 16A). This embossed relief structure functions as a phase shifting element on top of a photopolymer, which is illuminated with substantially coherent electromagnetic radiation. The radiation sensitive material is subsequently developed resulting in the structure shown in the bottom panel of FIG. 16A. Next, a line and space is indented into the radiation sensitive material (see top an bottom panels of FIG. 16B). A phase mask is positioned in conformal contact with the top of the indented structure of the radiation sensitive material and exposed to electromagnetic radiation. The top panel of FIG. 16C shows the step of building a multilevel phase mask by phase shifting dimple elements in the trench (top panel) and then indenting it to the radiation sensitive material. The final structure fabricated upon exposure to electromagnetic radiation and subsequent developing is shown in the lower panel of FIG. 16C.

The present Proximity field nanoPatterning techniques offer many advantages over conventional fabrication techniques for 3D nanostructures generally, and photonic bandgap materials in particular. Many of the unique advantages derive from direct conformal contact of conformable diffractive optics to photosensitive materials. This arrangement provides vibration tolerance, easy processing and integration of defect structure, and simple optical setup. In addition to its operation with one photon exposure in transparent photopolymers, the results presented in this example illustrate the viability of two photon processing methods. These and other capabilities enable the present Proximity field nanoPatterning methods to build useful photonic and phononic structures with geometries which have not been explored before.

We claim:

1. A method for making a 3D structure, said method comprising the steps of:
   providing a radiation sensitive material;
   generating a relief pattern on said radiation sensitive material;
   providing a substantially coherent beam of electromagnetic radiation; directing said substantially coherent beam of electromagnetic radiation onto said relief pattern; wherein said relief pattern generates a plurality of beams of electromagnetic radiation, thereby generating a optical interference pattern within said radiation sensitive material; wherein interactions of said electromagnetic radiation with said radiation sensitive material generates chemically modified regions of said radiation sensitive material; and
   removing at least a portion of said chemically modified regions of said radiation sensitive material or removing at least a portion of said radiation sensitive material which is not chemically modified, thereby generating said 3D structure.

2. A method for making a 3D structure, said method comprising the steps of:
   providing a substantially coherent beam of electromagnetic radiation;
   directing said substantially coherent beam of electromagnetic radiation onto a mask element in direct optical communication with a radiation sensitive material; wherein said mask element has at least one contact surface comprising a relief pattern in conformal contact with a contact surface of said radiation sensitive material, wherein said relief pattern generates a plurality of beams of electromagnetic radiation, thereby generating an optical interference pattern within said radiation sensitive material; wherein interactions of said electromagnetic radiation with said radiation sensitive material generates chemically modified regions of said radiation sensitive material,
   removing at least a portion of said chemically modified regions of said radiation sensitive material or removing at least a portion of said radiation sensitive material which is not chemically modified, thereby generating said 3D structure;
   wherein said relief pattern comprises an array of cylindrical posts.

3. A method for making a 3D structure, said method comprising the steps of:
   providing a substantially coherent beam of electromagnetic radiation;
   directing said substantially coherent beam of electromagnetic radiation onto a mask element in direct optical communication with a radiation sensitive material; wherein said mask element has at least one contact surface comprising a relief pattern in conformal contact with a contact surface of said radiation sensitive material, wherein said relief pattern generates a plurality of beams of electromagnetic radiation, thereby generating an optical interference pattern within said radiation sensitive material; wherein interactions of said electromagnetic radiation with said radiation sensitive material generates chemically modified regions of said radiation sensitive material,
   removing at least a portion of said chemically modified regions of said radiation sensitive material or removing at least a portion of said radiation sensitive material which is not chemically modified, thereby generating said 3D structure;
wherein said relief pattern comprises an array of cylindrical posts and said cylindrical posts have diameters and heights that are independently selected from a range that is greater than or equal to 50 nm and less than or equal to 5000 nm.

* * * * *